(12) United States Patent
Uchida et al.

(10) Patent No.: US 9,091,543 B2
(45) Date of Patent: Jul. 28, 2015

(54) ANGULAR SPEED SENSOR FOR DETECTING ANGULAR SPEED

(75) Inventors: Takashi Uchida, Fukui (JP); Toshio Yamazaki, Fukui (JP); Tomohiro Mitani, Fukui (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 318 days.

(21) Appl. No.: 13/579,346

(22) PCT Filed: Feb. 16, 2011

(86) PCT No.: PCT/JP2011/000842
§ 371 (c)(1),
(2), (4) Date: Aug. 16, 2012

(87) PCT Pub. No.: WO2011/102121
PCT Pub. Date: Aug. 25, 2011

(65) Prior Publication Data
US 2012/0312094 A1    Dec. 13, 2012

(30) Foreign Application Priority Data

Feb. 18, 2010  (JP) ................................ 2010-033121
Sep. 16, 2010  (JP) ................................ 2010-207505
Sep. 16, 2010  (JP) ................................ 2010-207506

(51) Int. Cl.
*G01C 19/56*        (2012.01)
*G01C 19/5628*     (2012.01)
(Continued)

(52) U.S. Cl.
CPC .......... *G01C 19/5628* (2013.01); *B81B 7/0016* (2013.01); *G01C 19/5769* (2013.01); *B81B 2201/0242* (2013.01)

(58) Field of Classification Search
CPC .................... G01C 19/5621; G01C 19/5783
USPC ...................................................... 73/504.12
See application file for complete search history.

(56) References Cited

U.S. PATENT DOCUMENTS

| 6,182,508 B1 | 2/2001 | Takeuchi et al. |
| 6,880,399 B1 | 4/2005 | Okoshi et al. |
| 2004/0200279 A1 | 10/2004 | Mitani et al. |

(Continued)

FOREIGN PATENT DOCUMENTS

| EP | 915322 | 5/1999 |
| EP | 1342990 | 9/2003 |

(Continued)

OTHER PUBLICATIONS

The Extended European Search Report dated Feb. 5, 2014 for the related European Patent Application No. EP11744412.

(Continued)

*Primary Examiner* — John Chapman, Jr.
(74) *Attorney, Agent, or Firm* — Panasonic Patent Center

(57) ABSTRACT

A placing member is configured to be supported from an outside by a terminal electrically connected to a terminal electrode, and an X-axis-direction extended portion, a Y-axis-direction extended portion, and a Z-axis-direction extended portion are provided in the terminal. This configuration provides an angular velocity sensor, in which a problem such that Y-axis-direction and Z-axis-direction vibrations applied from the outside cannot be damped is eliminated, and all the vibrations in three axis directions can be damped.

7 Claims, 20 Drawing Sheets

(51) Int. Cl.
*G01C 19/5769* (2012.01)
*B81B 7/00* (2006.01)

(56) References Cited

U.S. PATENT DOCUMENTS

| | | |
|---|---|---|
| 2005/0217377 A1 | 10/2005 | Ao |
| 2007/0082531 A1 | 4/2007 | Higuchi |
| 2009/0100929 A1 | 4/2009 | Ohkoshi |
| 2010/0089155 A1 | 4/2010 | Sugihara et al. |
| 2011/0036167 A1 | 2/2011 | Ohkoshi et al. |
| 2014/0020466 A1 | 1/2014 | Ohkoshi et al. |
| 2014/0352430 A1 | 12/2014 | Ohkoshi et al. |

FOREIGN PATENT DOCUMENTS

| | | |
|---|---|---|
| JP | 09-170926 | 6/1997 |
| JP | 10-227642 | 8/1998 |
| JP | 10-332387 | 12/1998 |
| JP | 2000-314628 * | 11/2000 |
| JP | 2001-324333 | 11/2001 |
| JP | 2002-071353 | 3/2002 |
| JP | 2003-004450 | 1/2003 |
| JP | 2003-028647 | 1/2003 |
| JP | 2005-283424 | 10/2005 |
| JP | 2005-326236 | 11/2005 |
| JP | 2005-331449 | 12/2005 |
| JP | 2007-040766 | 2/2007 |
| JP | 2007-107953 | 4/2007 |
| JP | 2007-212174 | 8/2007 |
| JP | 2009-080107 | 4/2009 |
| JP | 2010-025945 | 2/2010 |
| JP | 2010-111313 | 5/2010 |
| JP | 2010-190705 | 9/2010 |
| WO | 03/046479 | 6/2003 |
| WO | 2006/132277 | 12/2006 |
| WO | 2009/031285 | 3/2009 |

OTHER PUBLICATIONS

International Search Report of PCT Application No. PCT/JP2011/000842 dated May 24, 2011.

The Extended European Search Report dated Apr. 20 2015 for the related European Patent Application No. 14200345.8.

* cited by examiner

ANGULAR SPEED SENSOR FOR DETECTING ANGULAR SPEED

This application is a U.S. national phase application of PCT international application PCT/JP2011/000842 filed on Feb. 16, 2011 claiming priority based on Japanese application JP2010-033121 filed on Feb. 18, 2010, Japanese application JP2010-207505 filed on Sep. 16, 2010 and Japanese application JP2010-207506 filed on Sep. 16, 2010.

BACKGROUND

1. Technical Field

The present invention relates to an angular velocity sensor and an angular velocity and acceleration detecting composite sensor, which are particularly used in attitude control or a navigation system of a mobile body, such as an aircraft and a vehicle.

2. Background Art

FIG. 15 is a sectional view of a conventional angular velocity sensor. Referring to FIG. 15, the conventional angular velocity sensor generally has a structure, in which angular velocity sensor element 102 and IC 103 that controls angular velocity sensor element 102 are disposed in package 101. Recently, there has been proposed a structure in which, in order to suppress transmission of a disturbance vibration applied to package 101 to angular velocity sensor element 102, angular velocity sensor element 102 is placed in an internal space of package 101 while suspended by vibration-proof member 104.

In angular velocity sensor element 102, angular velocity sensor element 102 is mounted on vibration-proof member 104 with seat 105 interposed therebetween in order to ensure a vibrating space to detect an angular velocity, while a vibration type element is used to detect a flexural component of the element from a Coriolis force associated with an angular velocity applied about a detection axis when the driving vibration of the element is performed.

FIG. 16 is a schematic diagram illustrating a vibrating state of the angular velocity sensor element in the conventional angular velocity sensor. Referring to FIG. 16, when angular velocity sensor element 102 is mounted on seat 105 placed on a surface of vibration-proof member 104, a barycentric position of angular velocity sensor element 102 attached to package 101 with vibration-proof member 104 interposed therebetween is higher than a surface of vibration-proof member 104. Therefore, as illustrated by arrow 106, a flexural vibration is excited in vibration-proof member 104 in response to the disturbance vibration applied to package 101 from an outside, and the flexural vibration is mistakenly detected as an angular velocity of rotation about the detection axis.

FIG. 17 is an exploded perspective view of the conventional angular velocity sensor. FIG. 18 is a horizontal sectional view of the conventional angular velocity sensor. FIG. 19 is a perspective view of an accommodation unit in the conventional angular velocity sensor when viewed from below. FIG. 20 is a perspective view of a case in the conventional angular velocity sensor when viewed from above. FIG. 21 is a perspective view of the case in the conventional angular velocity sensor when viewed from below.

Referring to FIGS. 17 to 21, in case 230, multilayer circuit board 231 having a layer structure including ceramic and a wiring conductor is provided from an inner bottom surface to an outer bottom surface, and first wiring electrode 232 and second wiring electrode 233 are provided in an upper surface of multilayer circuit board 231 as illustrated in FIG. 20. IC 235, which is electrically connected to first wiring electrode 232 through wire 234 made of gold or aluminum, and capacitor 236, which is electrically connected to second wiring electrode 233, are provided in the upper surface of multilayer circuit board 231. IC 235 is accommodated in case 230, and processes an output signal outputted from vibrator 221. As illustrated in FIG. 21, six case electrodes 237 made of silver are provided on an outer bottom surface of multilayer circuit board 231 in case 230. As illustrated in FIG. 20, sidewall 238 made of ceramic is provided in an outer periphery of the upper surface of multilayer circuit board 231, and metal frame 239 made of kovar is provided on the upper surface of sidewall 238. As illustrated in FIG. 20, step portion 240 is provided in the inner bottom surface of case 230, third wiring electrodes 241 are provided in step portion 240 while vibrator 221 in FIG. 17 is fixed to step portion 240, and third wiring electrodes 241 are electrically connected to vibrator 221 through wire 234. An opening of case 230 is sealed by a metallic lid 242 such that the inside of case 230 becomes a vacuum atmosphere. Accommodation unit 243 made of resin is configured such that a direction perpendicular to an opposing board (not illustrated) that is a measured object of the angular velocity is set to a sensing axis of the angular velocity. Case 230 is accommodated in accommodation unit 243, and one end of each of at least three terminals 244, in which the other end is electrically connected to vibrator 221, is integrally buried in case 230. Placing unit 245 is provided in substantially parallel to the sensing axis of the angular velocity in accommodation unit 243 while located in a substantial center of accommodation unit 243, and case 230 is placed on placing unit 245. One end sides of terminals 244 are buried in placing unit 245, and leading end portions 244a on one end sides of terminals 244 are exposed from placing unit 245.

Case 230 is placed on placing unit 245 in accommodation unit 243, whereby case electrodes 237 in case 230 are electrically connected to leading end portions 244a on one end sides of terminals 244 in placing unit 245. Because leading end portions 244a on one end sides of terminals 244 are mechanically connected to case 230, case 230 is configured to be supported from an outside by terminals 244 in each of which the other end is integrally buried in accommodation unit 243.

As illustrated in FIG. 19, six electrode recesses 246 are provided in the outer bottom surface of accommodation unit 243, and the leading end portions on the sides of the other ends of terminals 244, which are integrally buried in accommodation unit 243, are exposed to electrode recesses 246 to provide supply electrode 247, GND electrode 248, output electrode 249, and three fixing electrodes 250. As illustrated in FIG. 18, Z-shape bending portion 244b is provided in the substantial center of each of six terminals 244, and Y-axis-direction extended portion 251 and Z-axis-direction extended portion 252 are provided by bending portion 244b, whereby case 230 is configured to be displaced in an X-axis direction with respect to accommodation unit 243. As illustrated in FIG. 19, three recesses 253 are provided in the outer bottom surface of accommodation unit 243. As illustrated in FIG. 19, in metallic cover 254, three latching pawls 256 are provided on the opening side, and the latching pawls 256 are swaged at recesses 253 in accommodation unit 243 illustrated in FIG. 19, thereby providing GND potential connection portion 255 in the outer bottom surface of accommodation unit 243 as illustrated in FIG. 19.

An operation of the conventional angular velocity sensor having the above configuration will be described below.

When vibrator 221 rotates at angular velocity ω about a center axis (sensing axis) in a longitudinal direction while performing flexion movement at an eigenfrequency, a Coriolis force of F=2 mV×ω is generated in an arm of vibrator 221. The output signal including a charge is inputted to IC 235 by the Coriolis force through wire 234, third wiring electrode 241, multilayer circuit board 231, first wiring electrode 232, and wire 234, and waveform processing is performed to the output signal. The output signal is inputted to an target computer (not illustrated) through second wiring electrode 233, capacitor 236, case electrode 237, leading end portion 244a on one side of terminal 244, terminal 244, and output electrode 249 to detect the angular velocity.

Assuming that a vibration in the X-axis direction is applied from the outside, case 230 is bent in the X-axis direction with respect to accommodation unit 243 because Y-axis-direction extended portion 251 and Z-axis-direction extended portion 252 are provided in terminal 244 in the conventional angular velocity sensor. Therefore, the X-axis-direction disturbance vibration applied from the outside is damped so as not to propagate to case 230.

For example, PTL 2 is well known as citation list information on the invention of the subject application.

However, in the above conventional configuration, because case 230 is bent in the X-axis direction with respect to accommodation unit 243, although the X-axis-direction disturbance vibration applied from the outside can be damped so as not to propagate to case 230, Y-axis-direction and Z-axis-direction vibrations applied from the outside cannot be damped.

FIG. 22 is an exploded perspective view of a conventional angular velocity and acceleration detecting composite sensor. FIG. 23 is a side sectional view of the conventional angular velocity and acceleration detecting composite sensor. FIG. 24 is a perspective view of an angular velocity detection element in the conventional angular velocity and acceleration detecting composite sensor. FIG. 25 is a perspective view of the conventional angular velocity and acceleration detecting composite sensor.

Referring to FIGS. 22 to 25, angular velocity detector 301 includes vibrating body 302 that is constructed by a tuning fork, in which single-crystal quartz thin films having different crystal axes are bonded to each other as illustrated in FIG. 24, case 303 that accommodates vibrating body 302, and lid 304 that closes an opening (not illustrated) provided in an upper surface of case 303. Driving electrodes 305 are provided on a frontside surface and a backside surface of vibrating body 302 constituting angular velocity detector 301, and detection electrodes 306 are provided on an outer side surface and an inner side surface of vibrating body 302. Case 303 constituting angular velocity detector 301 accommodates vibrating body 302 therein, and the opening (not illustrated) is provided in the upper surface of case 303. As illustrated in FIG. 22, supply terminal 307, angular velocity output terminal 308, and GND terminal 309 are provided in lid 304 constituting angular velocity detector 301 so as to pierce lid 304 from the upper surface to the lower surface, and one end of each of supply terminal 307 and GND terminal 309 is electrically connected to driving electrode 305 of vibrating body 302. One end of angular velocity output terminal 308 provided in lid 304 is electrically connected to detection electrode 306 of vibrating body 302.

In acceleration detector 311 in which an acceleration signal processing IC (not illustrated) is incorporated, a movable electrode plate (not illustrated) and a fixed electrode plate (not illustrated) are provided, and supply terminal 312, X-axis acceleration output terminal 313a, Y-axis acceleration output terminal 313b, and GND terminal 314, in each of which one end is electrically connected to the movable electrode plate (not illustrated) and the fixed electrode plate (not illustrated), are provided so as to project outward. Reference numeral 315 denotes a circuit board, angular velocity detector 301 is fixed to a lower surface of circuit board 315, many terminal insertion holes 316 are made from the upper surface to the lower surface of circuit board 315, and supply terminal 307, angular velocity output terminal 308, and GND terminal 309 of angular velocity detector 301 are inserted in terminal insertion holes 316. Acceleration detector 311 is fixed to the lower surface of circuit board 315, and angular velocity signal processing IC 317 including an electronic component in which an AGC circuit (not illustrated) is provided is provided in the upper surface of circuit board 315. Supply terminal 307, angular velocity output terminal 308, and GND terminal 309 of angular velocity detector 301 and supply terminal 312, X-axis acceleration output terminal 313a, Y-axis acceleration output terminal 313b, and GND terminal 314 of acceleration detector 311 are electrically connected to angular velocity signal processing IC 317.

Shielded case 318 includes metallic accommodation unit 318a and lid 318c that closes opening 318b of accommodation unit 318a. Shielded case 318 accommodates circuit board 315, angular velocity detector 301, and acceleration detector 311 therein, and power relay terminal 319, GND relay terminal 320, angular velocity relay terminal 321, X-axis acceleration relay terminal 322, and Y-axis acceleration relay terminal 323 are provided in shielded case 318 so as to pierce from the inside to the outside. In shielded case 318, one end of power relay terminal 319 is electrically connected to supply terminal 307 of angular velocity detector 301 and supply terminal 312 of acceleration detector 311, and one end of GND relay terminal 320 is electrically connected to GND terminal 309 of angular velocity detector 301 and GND terminal 314 of acceleration detector 311. One end angular velocity relay terminal 321 is electrically connected to angular velocity output terminal 308 of angular velocity detector 301, one end of X-axis acceleration relay terminal 322 is electrically connected to X-axis acceleration output terminal 313a of acceleration detector 311, and one end of Y-axis acceleration relay terminal 323 is electrically connected to Y-axis acceleration output terminal 313b of acceleration detector 311. Biasing portions 324 constructed by elastic protrusions, each of which is formed by making a cut in a perpendicular portion 318d, are provided in lid 318c of shielded case 318. Lid 318c is elastically crimped in an outer side surface of opening 318b of shielded case 318 by biasing portions 324, whereby accommodation unit 318a is set to the same potential as lid 318c.

Resin protective case 325 having a cylindrical shape with a bottom accommodates shielded case 318 therein, connector 326 is provided in protective case 325 so as to project outward from the side surface, one end of each of power connector terminal 327, angular velocity connector terminal 328, X-axis acceleration connector terminal 329, Y-axis acceleration connector terminal 330, and GND connector terminal 331 is provided inside connector 326, and the other end is buried in protective case 325. As illustrated in FIG. 25, through-holes 332 are made in protective case 325 from the bottom surface to the outer bottom surface, and the other end of each of power connector terminal 327, angular velocity connector terminal 328, X-axis acceleration connector terminal 329, Y-axis acceleration connector terminal 330, and GND connector terminal 331 is located in through-hole 332 made in protective case 325. The other end of X-axis acceleration relay terminal 322 is inserted in a hole (not illustrated) of X-axis acceleration connector terminal 329 of protective case 325, and electrically connected by solder 335. The other end of Y-axis acceleration relay terminal 323 is inserted in a hole (not illustrated) of Y-axis acceleration connector terminal 330, and electrically connected by solder 335. The other end of power relay terminal 319 is inserted in a hole (not illustrated) of power connector terminal 327, and electrically connected by solder 335. The other end of angular velocity relay terminal 321 is inserted in a hole (not illustrated) of angular velocity connector terminal 328, and electrically connected by solder 335. The other end of GND relay terminal 320 is inserted in a hole (not illustrated) of GND connector terminal 331, and electrically connected by solder 335. Resin protective lid 336 closes the opening provided in the upper surface of protective case 325.

An operation of the conventional angular velocity and acceleration detecting composite sensor configured and assembled as described above will be described below.

A DC voltage of an externally-provided power supply (not illustrated) is converted into an AC voltage by power connector terminal 327, power relay terminal 319, and angular velocity signal processing IC 317, and the AC voltage is applied to driving electrode 305 of vibrating body 302 of angular velocity detector 301 through supply terminal 307. Similarly, driving electrode 305 is grounded through GND connector terminal 331, GND relay terminal 320, and GND terminal 309, whereby vibrating body 302 performs a flexion vibration. At this point, when angular velocity detector 301 rotates at angular velocity ω about the center axis in the longitudinal direction of vibrating body 302, the Coriolis force of $F=2\,mv \times \omega$ is generated in vibrating body 302. The output signal including the charge generated in detection electrode 306 by the Coriolis force is converted into an output voltage through angular velocity output terminal 308 by angular velocity signal processing IC 317 of circuit board 315, and the output voltage is inputted to the target computer (not illustrated) through angular velocity relay terminal 321 and angular velocity connector terminal 328 to detect the angular velocity. Similarly, when the acceleration is applied in the X-axis direction and the Y-axis direction, which are directions horizontal to a plane of acceleration detector 311, while 5 V is applied to the movable electrode plate (not illustrated) and the fixed electrode plate (not illustrated) of acceleration detector 311 through power connector terminal 327, power relay terminal 319, and supply terminal 307, the movable electrode plate (not illustrated) moves to change a capacity of a capacitor provided between the movable electrode plate (not illustrated) and the fixed electrode plate (not illustrated). The change in capacity is converted into the output voltage in acceleration detector 311, and the acceleration in the X-axis direction is inputted to the target computer (not illustrated) through X-axis acceleration output terminal 313a, X-axis acceleration relay terminal 322, and X-axis acceleration connector terminal 329 to detect the acceleration in the X-axis direction. Similarly, the acceleration in the Y-axis direction is inputted to the target computer (not illustrated) through Y-axis acceleration output terminal 313b, Y-axis acceleration relay terminal 323, and Y-axis acceleration connector terminal 330 to detect the acceleration in the Y-axis direction. The angular velocity applied to the vehicle body, acceleration in the X-axis direction, and the acceleration in the Y-axis direction are analyzed by the target computer (not illustrated) to analyze a behavior of the vehicle body.

For example, PTL 3 is well known as citation list information on the invention of the subject application.

However, in the conventional configuration, because supply terminal 307, angular velocity output terminal 308, and GND terminal 309 of angular velocity detector 301 are rigidly fixed to circuit board 315, the flexion vibration of vibrating body 302 in angular velocity detector 301 is directly transmitted to acceleration detector 311 through circuit board 315. When the movable electrode plate of acceleration detector 311 moves, the acceleration output signal is detected even though the acceleration is not generated.

CITATION LIST

Patent Literatures

PTL 1: Unexamined Japanese Patent Publication No. 2005-331449
PTL 2: Japanese Translation of PCT Publication No. 03/046479
PTL 3: Unexamined Japanese Patent Publication No. 2003-4450

SUMMARY

An object of the present invention is to improve detection accuracy of the angular velocity sensor.

In the angular velocity sensor in which the angular velocity sensor element is suspended in the internal space of the package with the vibration-proof member interposed therebetween, the present invention has a structure, in which the vibration-proof member is divided into a connection portion to the package, a connection portion to a seat, and a suspension portion located between the connection portions and a height in a barycentric position of the suspension portion is matched with a height in a barycentric position of a composite body including the angular velocity sensor element, the seat, and the connection portion to the seat in the vibration-proof member.

According to the configuration, the present invention can suppress an influence of the disturbance vibration on the angular velocity sensor element to improve the detection accuracy of the angular velocity sensor.

The present invention provides the angular velocity sensor, in which the problem such that the Y-axis-direction and Z-axis-direction vibrations applied from the outside cannot be damped is eliminated, and all the vibrations in the three axis directions can be damped.

The present invention includes: a tuning-fork type vibrator in which a driving electrode, a detection electrode, and a support portion are provided; an IC that processes an output signal outputted from the detection electrode of the vibrator; a placing member that supports the support portion of the vibrator; and a case that accommodates the vibrator, the IC, and the placing member therein, a terminal electrode being provided in a step portion of the case, a supply electrode, a GND electrode, and an output electrode being provided in an outer bottom surface of the case, a wiring pattern that electrically connects the terminal electrode and the supply electrode, the GND electrode, and the output electrode being provided in the case, wherein the placing member is configured to be supported from an outside by a terminal electrically connected to the terminal electrode. An X-axis-direction extended portion, a Y-axis-direction extended portion, and a Z-axis-direction extended portion are provided in the terminal. According to the configuration, because the X-axis-direction extended portion, the Y-axis-direction extended portion, and the Z-axis-direction extended portion are provided in the terminal, the Z-axis-direction vibration applied from the outside is damped by the X-axis-direction extended portion and the Y-axis-direction extended portion, the X-axis-direction vibration applied from the outside is damped by the Y-axis-direction extended portion and the Z-axis-direction extended portion, and the Y-axis-direction vibration applied from the outside is damped by the Z-axis-direction extended portion and the X-axis-direction extended portion. Therefore, all the vibrations in the three axis directions can be damped.

The present invention also provides an angular velocity and acceleration detecting composite sensor, in which the problem such that the acceleration output signal is detected even though the acceleration is not generated by directly transmitting the flexion vibration of the vibrating body in the angular velocity detector to the acceleration detector is eliminated to improve the reliability.

The present invention includes: a vibrator that detects an angular velocity; an acceleration sensor element that detects acceleration; an IC that processes an angular velocity output signal generated from the vibrator and an acceleration output signal generated from the acceleration sensor element; and a case that accommodates the vibrator, the acceleration sensor element, and the IC, a terminal electrode being provided in an inner side surface of the case, a supply electrode, a GND electrode, and an output electrode being provided in an outer bottom surface of the case, wherein the vibrator is fixed to the case with a terminal interposed therebetween, and the acceleration sensor element is rigidly fixed to the case. According to the configuration, the vibrator is fixed to the case with the terminal interposed therebetween, the acceleration sensor element is rigidly fixed to the case. Therefore, the problem such that the acceleration output signal is detected even though the acceleration is not generated is eliminated because the flexural vibration of the vibrator is damped by the terminal and thus the vibration of the vibrator is hardly transmitted to the acceleration sensor element, and the acceleration can accurately be detected because the acceleration sensor element is rigidly fixed to the case.

DESCRIPTION OF EMBODIMENTS

First Exemplary Embodiment

Hereinafter, a first exemplary embodiment of the present invention will be described with reference to the drawings.

Figure 1:
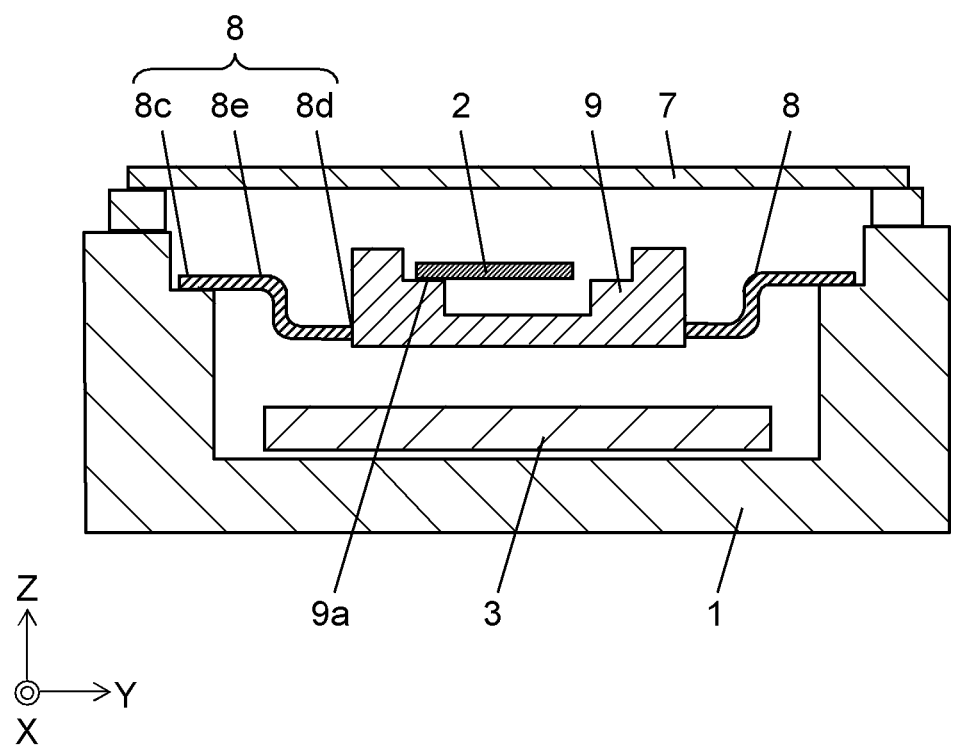
FIG. 1 is a sectional view of an angular velocity sensor according to a first exemplary embodiment of the present invention.

FIG. 1 is a sectional view of an angular velocity sensor according to a first exemplary embodiment of the present invention. Referring to FIG. 1, in a basic structure of the angular velocity sensor of the first exemplary embodiment, angular velocity sensor element 2 and IC 3 are disposed in an internal space of package 1 made of laminated ceramic, and an opening of package 1 is sealed by lid 7. IC 3 includes a drive control circuit that applies a driving signal to angular velocity sensor element 2 and a detection circuit that processes a detection signal outputted from angular velocity sensor element 2.

Angular velocity sensor element 2 has a structure in which angular velocity sensor element 2 is supported by seat 9, which is suspended in the internal space of package 1 by vibration-proof member 8 made of a flexible plate-spring material or a flexible elastic material, such that the disturbance vibration is not transmitted through package 1.

Figure 2:
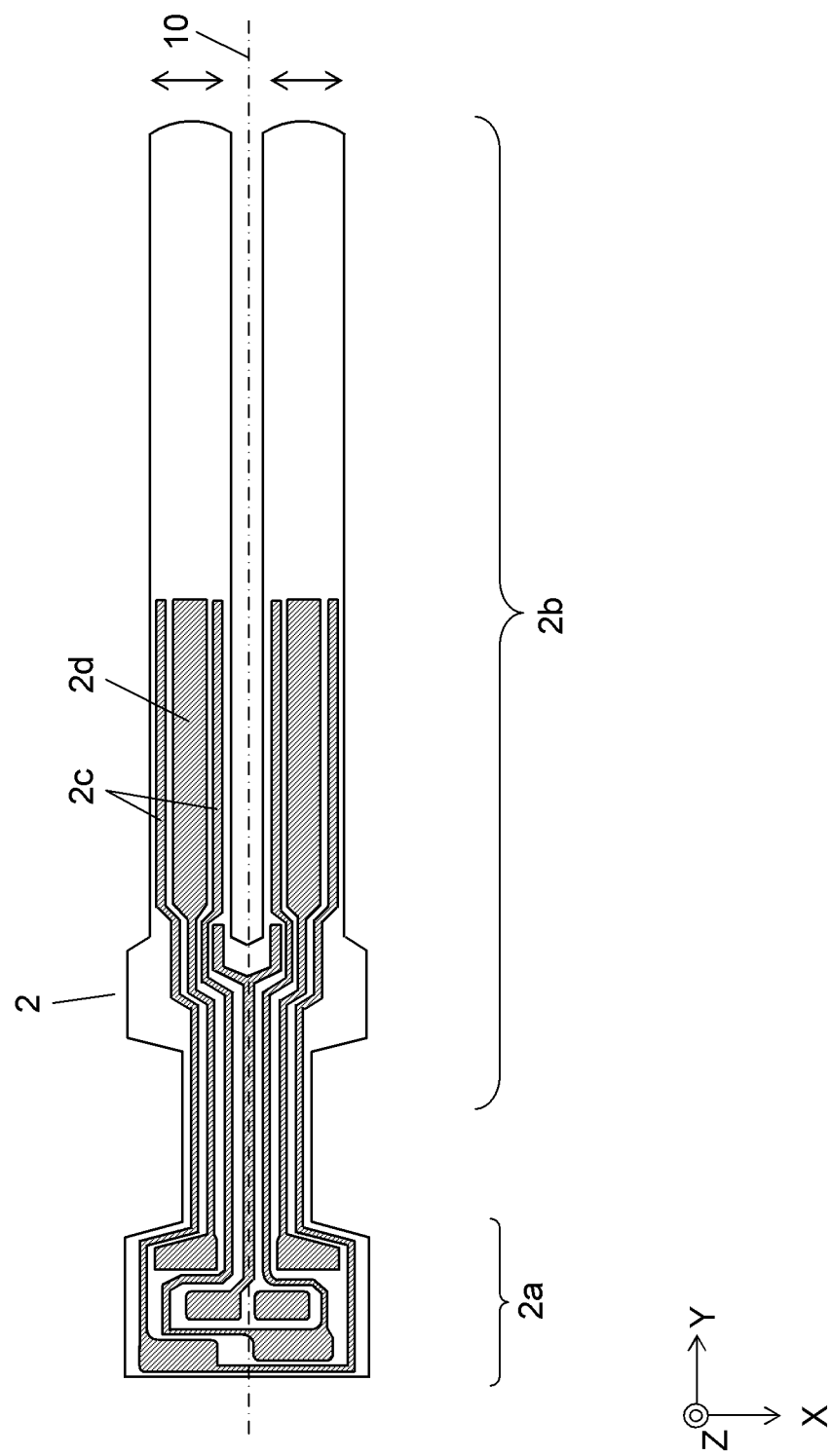
FIG. 2 is a plan view of an angular velocity sensor element constituting the angular velocity sensor according to the first exemplary embodiment of the present invention.

FIG. 2 is a plan view of the angular velocity sensor element constituting the angular velocity sensor according to the first exemplary embodiment of the present invention. Referring to FIG. 2, angular velocity sensor element 2 is a tuning-fork type vibration element in which driving electrodes 2c and sensing electrodes 2d are provided on a pair of driving arms 2b extended along detection axis 10 from support portion 2a, and angular velocity sensor element 2 has a structure, in which a portion on which angular velocity sensor element 2 is mounted in seat 9 is formed into a step structure as illustrated in FIG. 1 and support portion 2a of angular velocity sensor element 2 is mounted on an upper step surface 9a to ensure a vibrating space of driving arm 2b.

Figure 3:
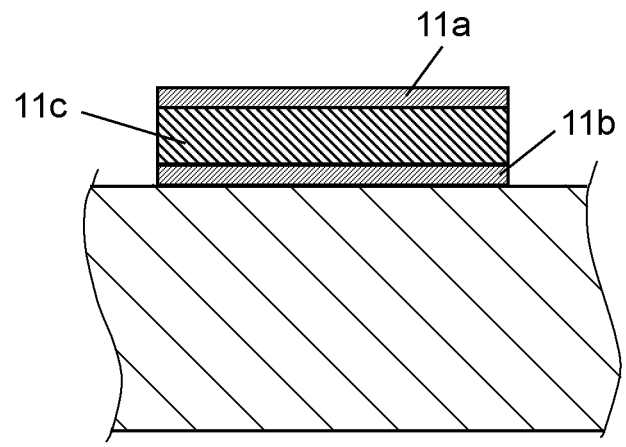
FIG. 3 is a view illustrating a structure of an electrode provided in the angular velocity sensor element constituting the angular velocity sensor according to the first exemplary embodiment of the present invention.

FIG. 3 is a view illustrating a structure of an electrode provided in the angular velocity sensor element constituting the angular velocity sensor according to the first exemplary embodiment of the present invention. Referring to FIG. 3, angular velocity sensor element 2 is constructed by a substrate made of Si, a structure of each electrode provided on a surface of the Si substrate is formed by upper electrode 11a made of Au, lower electrode 11b made of Pt, and piezoelectric body layer 11c, which is disposed between upper electrode 11a and lower electrode 11b and made of PZT. When a positive voltage is applied to upper electrode 11a while lower electrode 11b is grounded, a compression force acts in a direction in which the electrodes are laminated, and a stress is generated by the compression force in a direction in which an electrode pattern extends. On the other hand, when a negative voltage is applied, a tension force acts on the electrode, and the stress is generated by the tension force in a direction in which the electrode pattern shrinks. On the contrary, the electrode shrinks by the flexion of the driving arm 2b to generate the negative voltage, and the electrode extends to generate the positive voltage.

As to the detection of the angular velocity, a driving voltage is applied to driving electrode 2c as illustrated in FIG. 2 from IC 3 to perform a driving vibration of driving arm 2b in an X-axis direction as illustrated by an arrow, namely, in a direction in which driving arms 2b are provided in parallel. In the driving vibration state, the angular velocity is applied about the detection axis to generate a flexural vibration of driving arm 2b by a Coriolis force in a Z-axis direction (a direction orthogonal to a vibration plane (XY-plane) formed by the driving vibration), the flexural vibration is converted into an electric signal by sensing electrode 2d, and the electric signal is outputted to IC 3.

Figure 4:
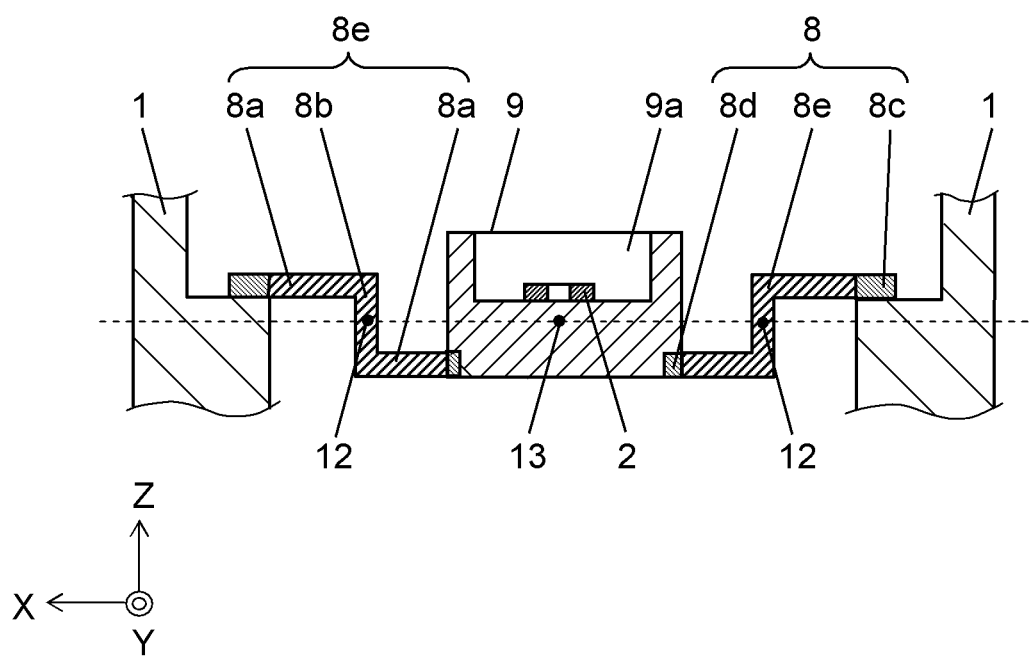
FIG. 4 is a schematic diagram illustrating a suspended state of the angular velocity sensor element constituting the angular velocity sensor according to the first exemplary embodiment of the present invention.

FIG. 4 is a schematic diagram illustrating a suspended state of the angular velocity sensor element constituting the angular velocity sensor according to the first exemplary embodiment of the present invention. Referring to FIG. 4, vibration-proof member 8 has a step structure including surface 8a and surface 8b. Surface 8a is parallel to the vibration plane (XY-plane) in the driving vibration of angular velocity sensor element 2, and surface 8b is orthogonal to the vibration plane (XY-plane). In the structure of vibration-proof member 8, the disturbance vibration in the direction (Z-axis direction) orthogonal to the vibration direction is suppressed by a vibration-proof effect of surface 8a parallel to the vibration plane (XY-plane), and the disturbance vibration in the direction (in-plane direction in the XY-plane) parallel to the vibration plane is suppressed by a vibration-proof effect of surface 8b orthogonal to the vibration plane (XY-plane).

In the angular velocity sensor, an outside portion of vibration-proof member 8 is connected to package 1 as connection portion 8c, an inside portion of vibration-proof member 8 is connected to seat 9 as connection portion 8d, and a height of barycentric position 12 of suspension portion 8e between connection portions 8c and 8d is matched with a height of barycentric position 13 of a composite body including angular velocity sensor element 2, seat 9, and connection portion 8d to seat 9, namely, a whole portion suspended by suspension portion 8e, thereby improving detection accuracy of the angular velocity sensor. As used herein, "the heights of barycentric positions 12 and 13 are matched with each other" means that the relative heights of the barycentric positions are matched based on the vibration plane in the driving vibration of angular velocity sensor element 2.

Figure 16:
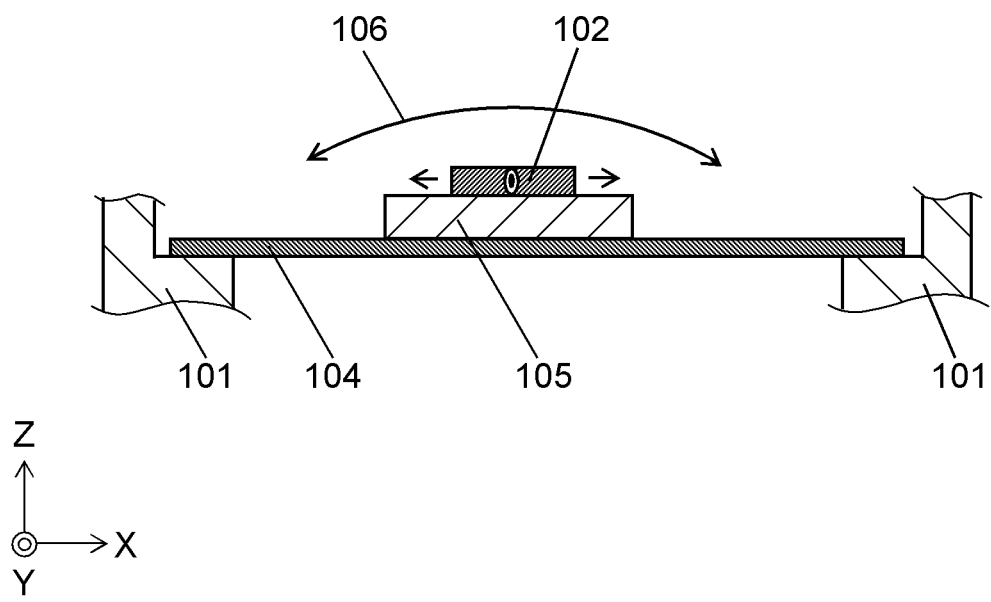
FIG. 16 is a schematic diagram illustrating a vibrating state of an angular velocity sensor element in the conventional angular velocity sensor.
Figure 17:
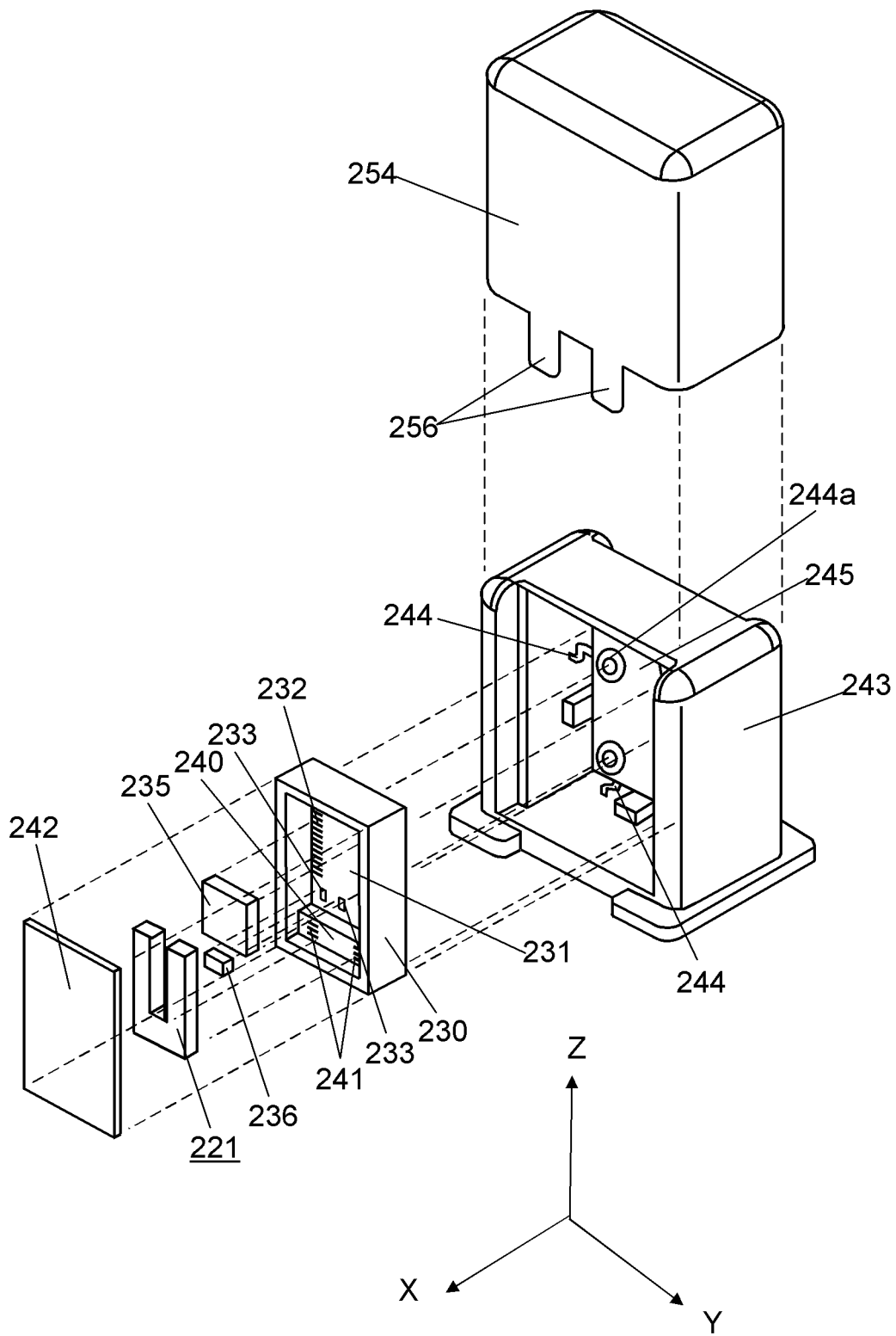
FIG. 17 is an exploded perspective view of the conventional angular velocity sensor.
Figure 18:
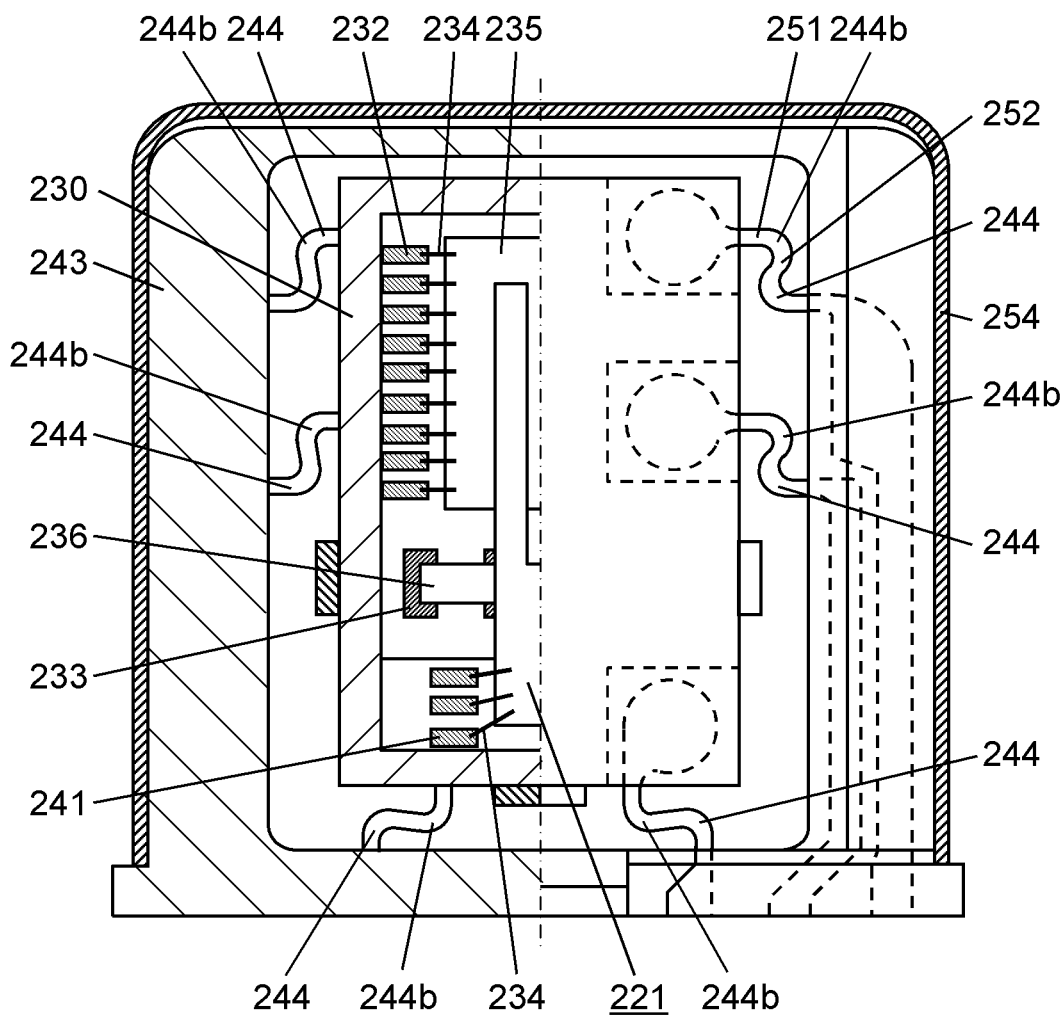
FIG. 18 is a horizontal sectional view of the conventional angular velocity sensor.
Figure 18:
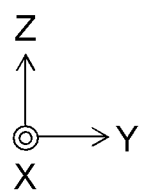
Figure 19:
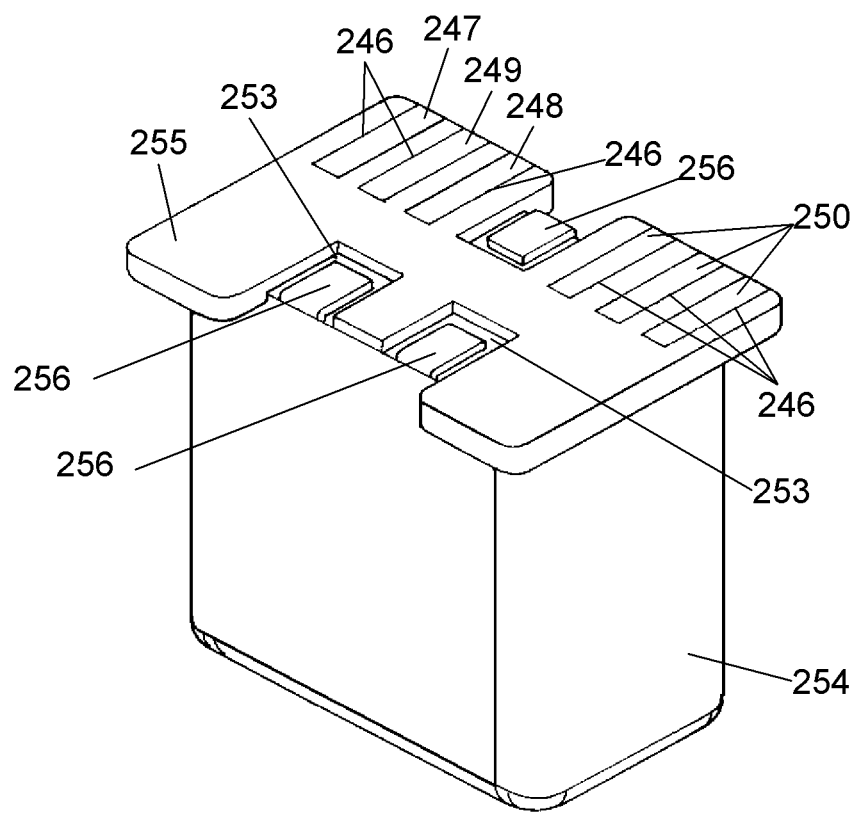
FIG. 19 is a perspective view of an accommodation unit in the conventional angular velocity sensor when viewed from below.
Figure 20:
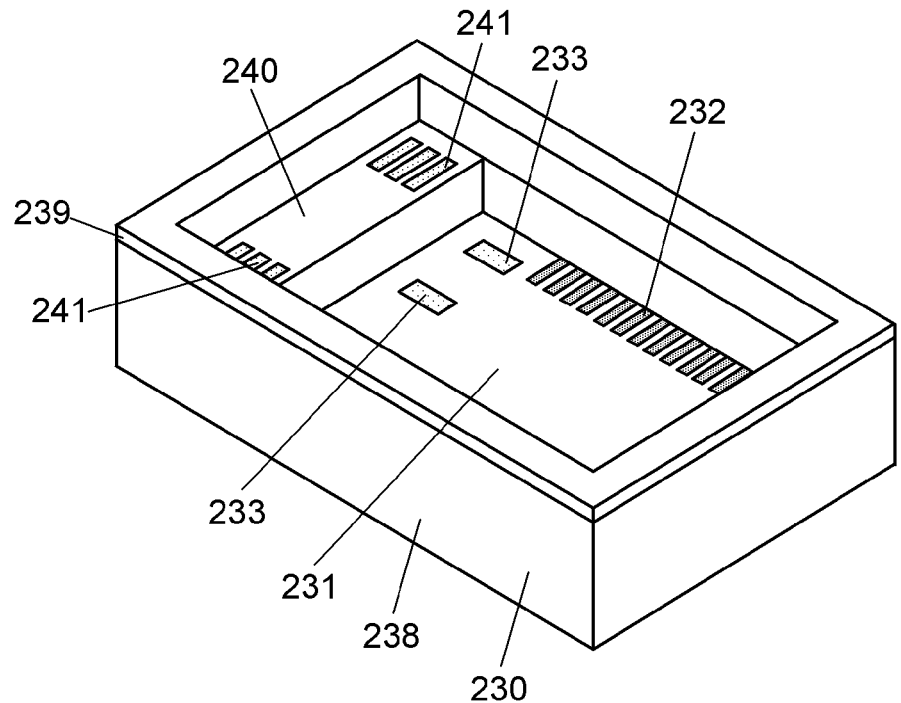
FIG. 20 is a perspective view of a case in the conventional angular velocity sensor when viewed from above.
Figure 21:
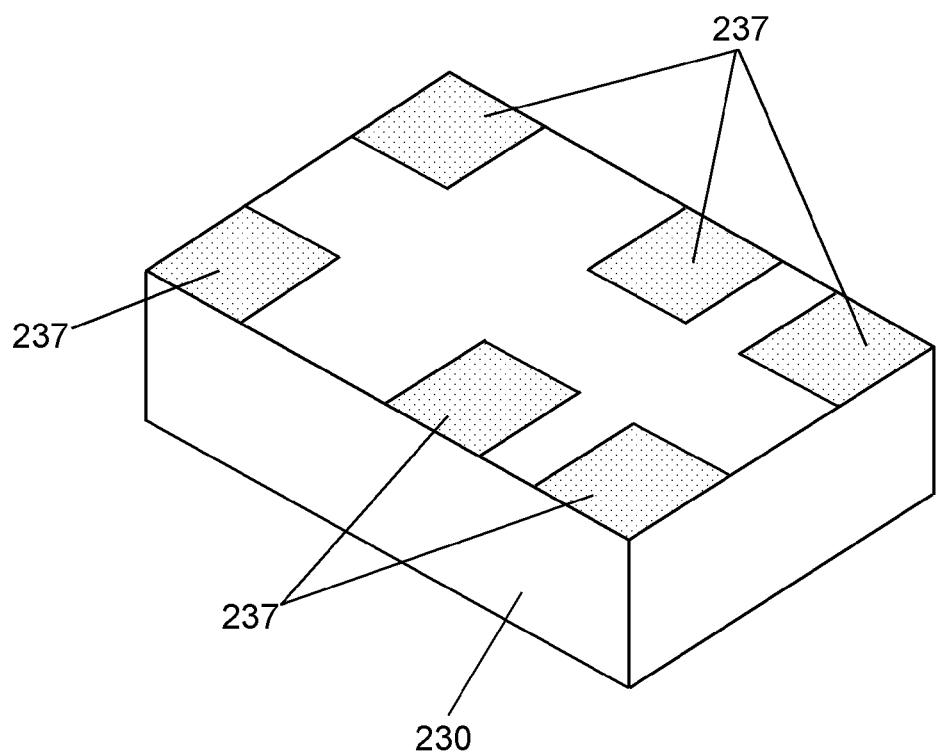
FIG. 21 is a perspective view of the case in the conventional angular velocity sensor when viewed from below.
Figure 22:
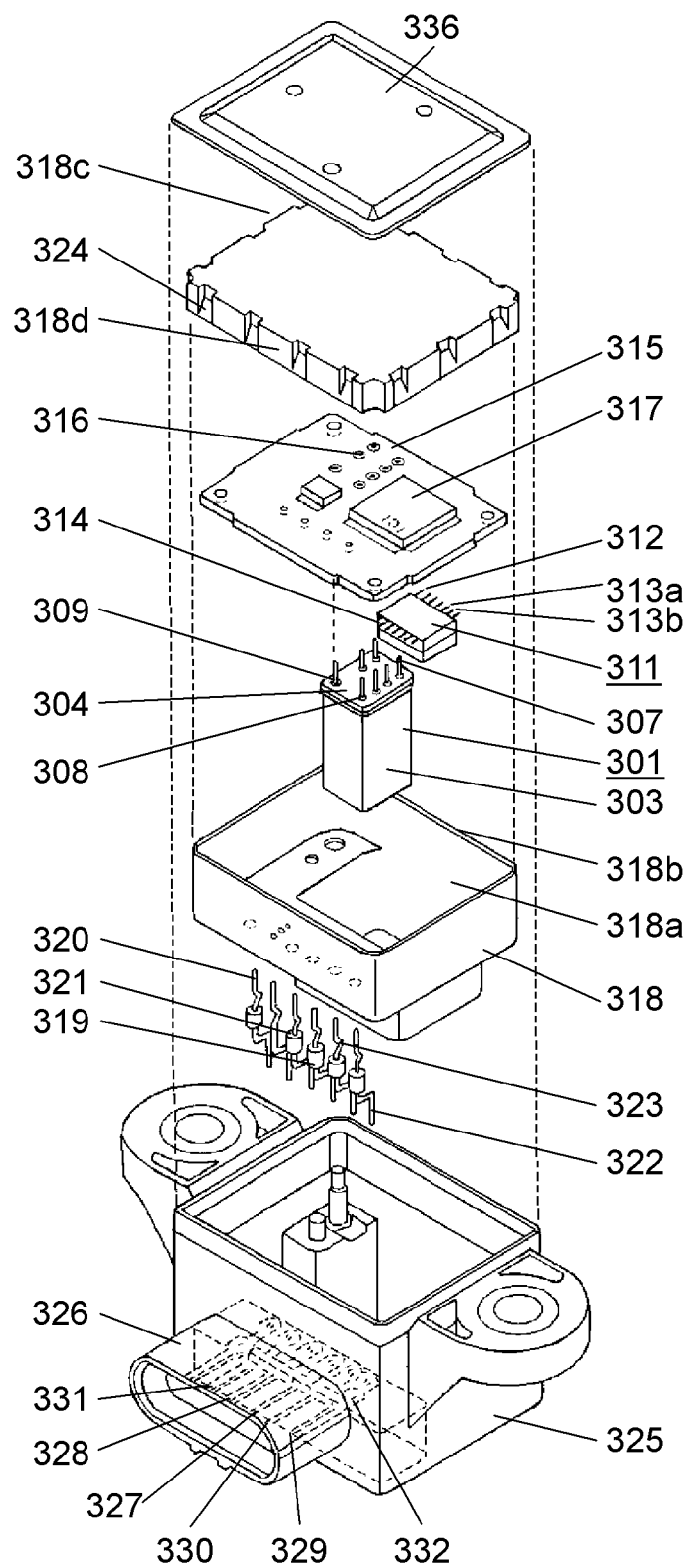
FIG. 22 is an exploded perspective view of a conventional angular velocity and acceleration detecting composite sensor.
Figure 23:
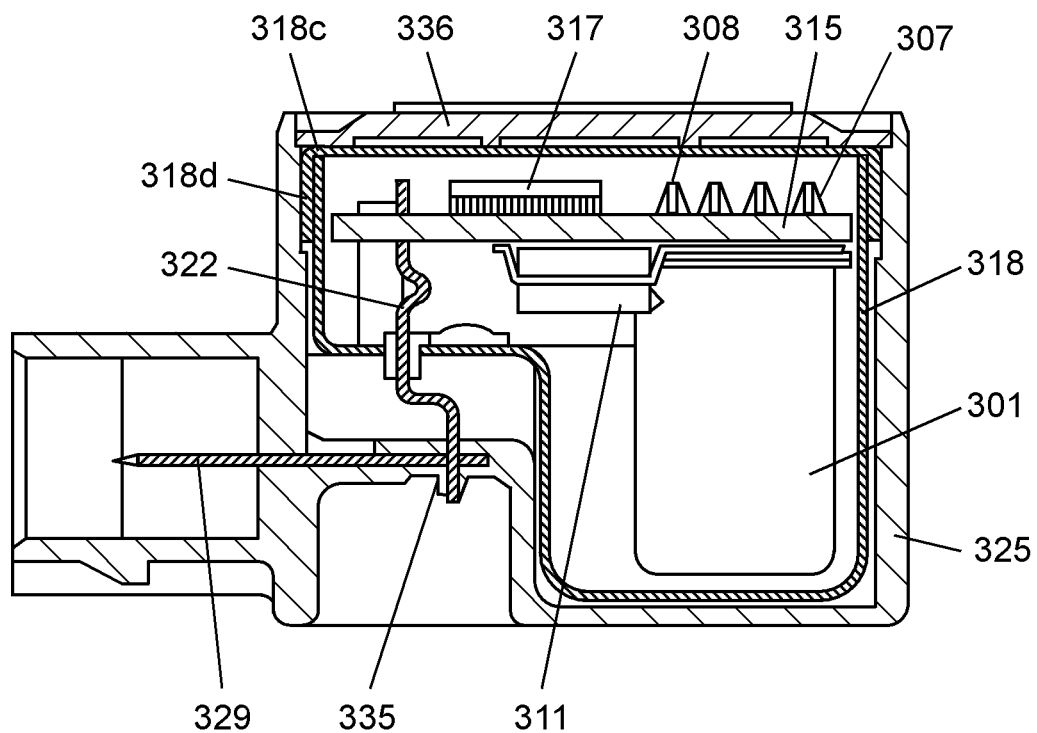
FIG. 23 is a side sectional view of the conventional angular velocity and acceleration detecting composite sensor.
Figure 24:
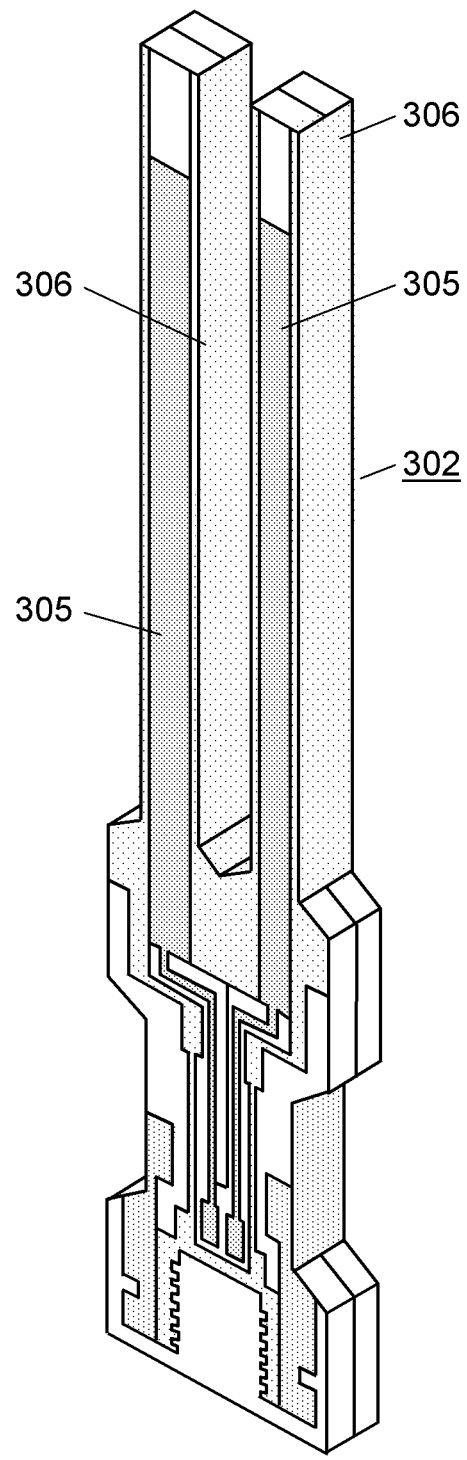
FIG. 24 is a perspective view of an angular velocity detection element in the conventional angular velocity and acceleration detecting composite sensor.
Figure 25:
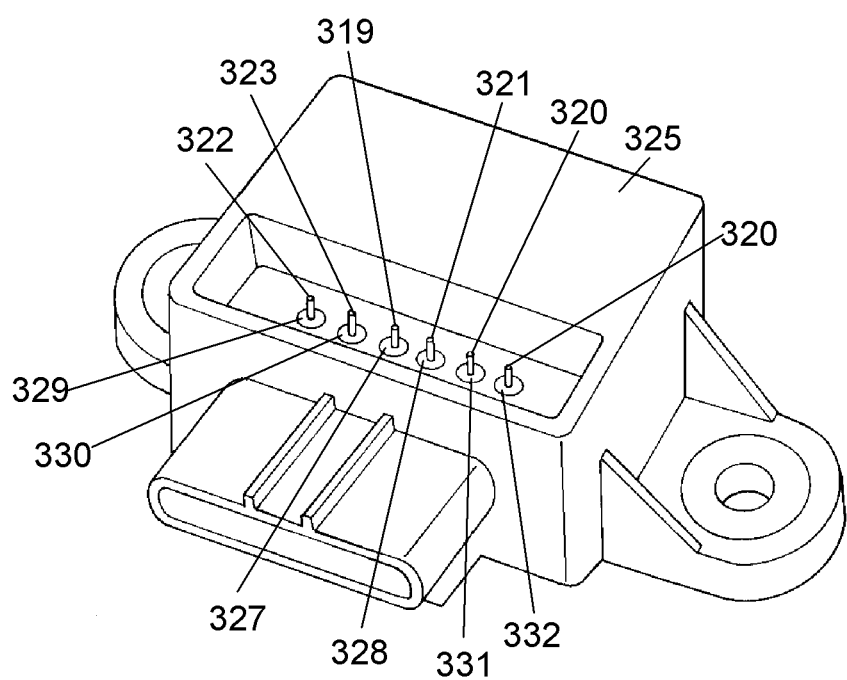
FIG. 25 is a perspective view of the conventional angular velocity and acceleration detecting composite sensor.

That is, when the height of barycentric position 12 of suspension portion 8e is matched with the height of barycentric position 13 of the composite body suspended by suspension portion 8e, the generation of the flexion vibration indicated by arrow 106 is suppressed in the configuration in which the barycentric position of conventional angular velocity sensor element 102 is located above vibration-proof member 104 as described with reference to FIG. 16, and output of an unnecessary detection signal of the disturbance vibration can be suppressed. As a result, the detection accuracy of the angular velocity sensor can be enhanced.

Although not illustrated, when vibration-proof member 8 has a flat structure, the same effect is obtained such that the height of barycentric position 12 of suspension portion 8e is matched with the height of barycentric position 13 of the composite body including angular velocity sensor element 2 suspended by suspension portion 8e.

In angular velocity sensor element 2 described in the foregoing description, as illustrated in FIG. 2, the detection axis (Y-axis) is parallel to the driving vibration plane (XY-plane) in which the driving vibration of driving arm 2b is performed. Alternatively, the angular velocity sensor having the different detection axial direction may be formed into a substantially same shape using the angular velocity sensor element in which the detection axis (Z-axis) is orthogonal to the vibration plane (XY-plane).

Figure 5:
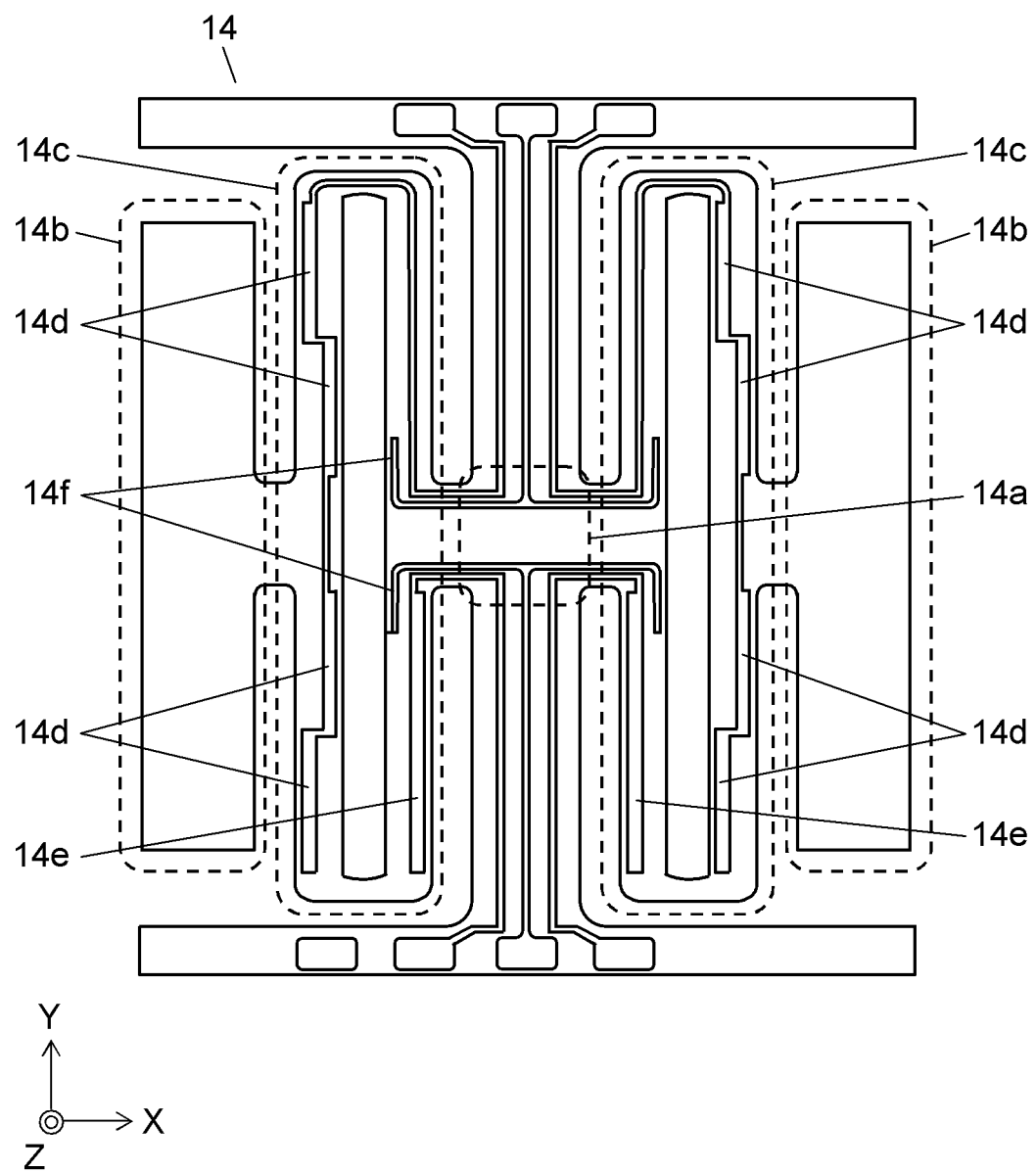
FIG. 5 is a plan view of another angular velocity sensor element constituting the angular velocity sensor according to the first exemplary embodiment of the present invention.

FIG. 5 is a plan view of another angular velocity sensor element constituting the angular velocity sensor according to the first exemplary embodiment of the present invention. Referring to FIG. 5, in angular velocity sensor element 14 in which the detection axis (Z-axis) is orthogonal to the driving vibration plane (XY-plane), weights 14b are symmetrically disposed on both sides of fixed portion 14a located in a central portion, weights 14b are connected by a pair of driving arms 14c, and driving electrode 14d, detection electrode 14e, and monitor electrode 14f which will be described later are disposed on driving arm 14c.

Figure 6:
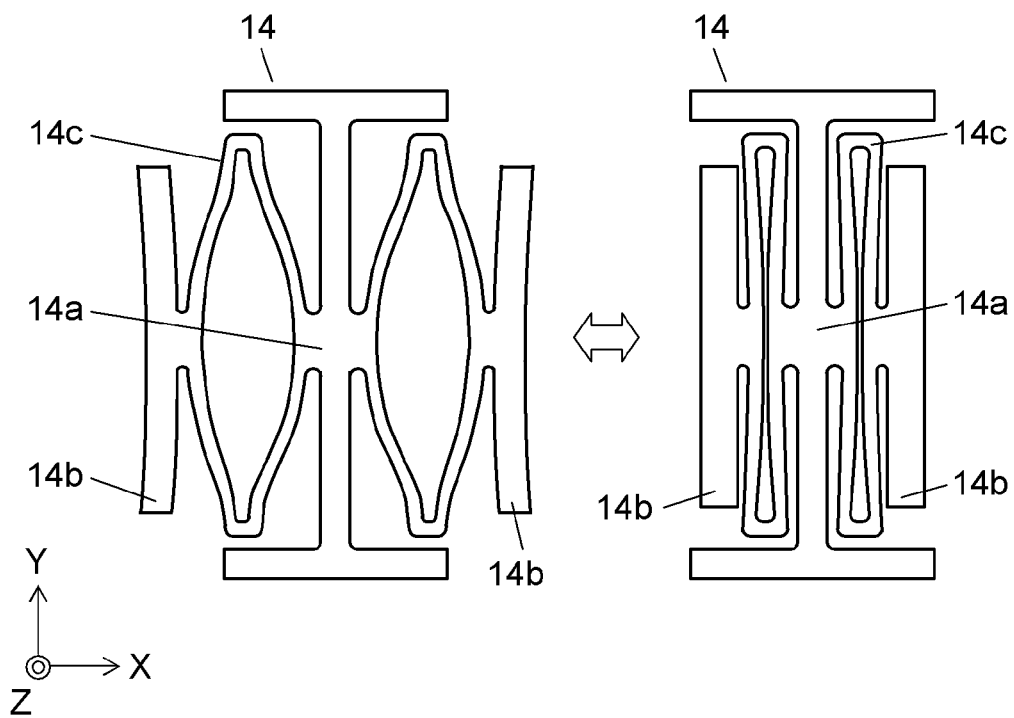
FIG. 6 is a schematic diagram illustrating a driving state of another angular velocity sensor element constituting the angular velocity sensor according to the first exemplary embodiment of the present invention.
Figure 7:
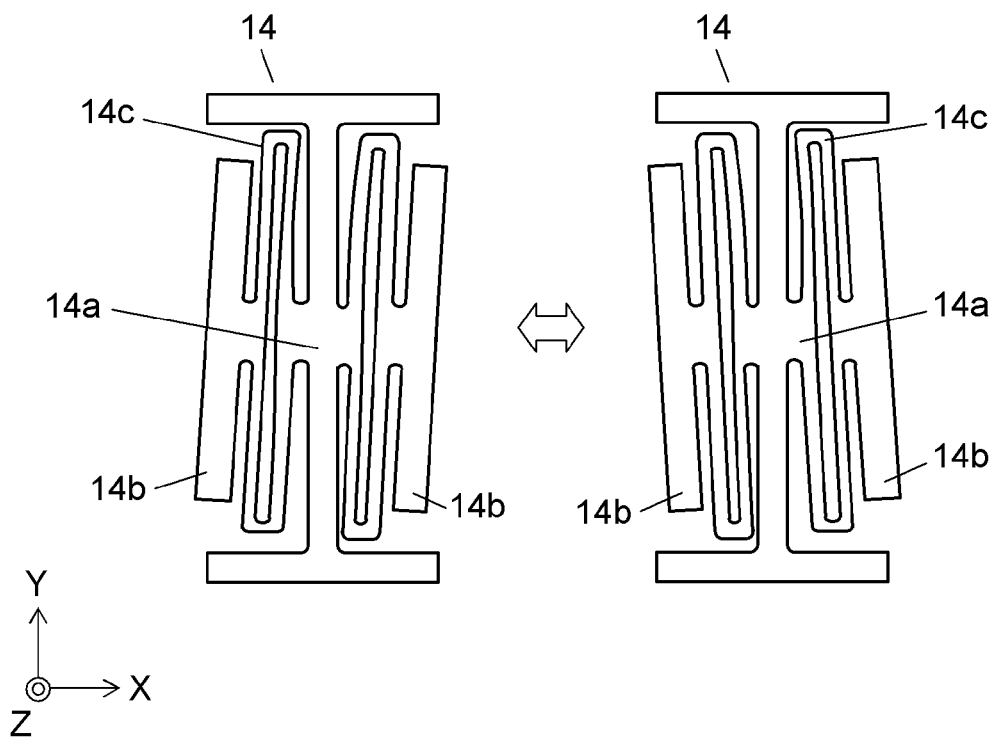
FIG. 7 is a schematic diagram illustrating a detection state of another angular velocity sensor element constituting the angular velocity sensor according to the first exemplary embodiment of the present invention.

FIG. 6 is a schematic diagram illustrating a driving state of another angular velocity sensor element constituting the angular velocity sensor according to the first exemplary embodiment of the present invention. FIG. 7 is a schematic diagram illustrating a detection state of another angular velocity sensor element constituting the angular velocity sensor according to the first exemplary embodiment of the present invention. Referring to FIGS. 6 and 7, the driving signal is applied to driving electrode 14d from IC 3 to perform the driving vibration such that driving arm 14c symmetrically extends and shrinks weight 14b in the direction (X-axis direction) in which fixed portion 14a and weight 14b are connected. In the driving vibration state, the direction (Z-axis direction) perpendicular to the vibration plane (XY-plane) of angular velocity sensor element 14 is set to the detection axis, and the angular velocity is received about the detection axis to generate the Coriolis force. Driving arm 14c vibrates in the direction (Y-axis direction) orthogonal to the driving vibration direction (X-axis direction) by the Coriolis force, a deformation of driving arm 14c by detection vibration is sensed by detection electrode 14e, and the electric signal is outputted to IC 3. That is, the angular velocity sensor element has the vibration element structure in FIGS. 6 and 7.

Like tuning-fork type angular velocity sensor element 2 illustrated in FIG. 2, angular velocity sensor element 14 has the structure in which angular velocity sensor element 14 is suspended by vibration-proof member 8 while the vibrating space is ensured by the seat. Therefore, as illustrated in FIG. 4, the height of barycentric position 12 of suspension portion 8e is matched with the height of barycentric position 13 of the composite body including angular velocity sensor element 14, seat 9, and connection portion 8d to seat 9 in vibration-proof member 8, namely, the whole portion suspended by suspension portion 8e, which allows the detection accuracy to be enhanced in the angular velocity sensor.

The function of ensuring the vibrating space of angular velocity sensor element 2 in seat 9 may be formed in vibration-proof member 8. For example, although not illustrated, a sheet-like elastic material, such as a liquid crystal polymer, is integrally molded to form a step structure in which angular velocity sensor element 2 is supported so as to be able to vibrate. The step structure acts as seat 9, and the surrounding sheet portion acts as vibration-proof member 8, so that the number of components can be decreased in the angular velocity sensor to improve productivity. In the configuration in which the composite body of vibration-proof member 8 and seat 9 is integrally molded, a thickness of vibration-proof member 8 is easy to ensure. In this case, the vibration-proof effect can be obtained in the thickness direction (Z-axis direction), and the detection accuracy of the angular velocity sensor can further be enhanced.

The liquid crystal polymer that is used as the elastic member constituting vibration-proof member 8 has not only vibration absorbing performance, but also good fluidity because of a low melting viscosity. Therefore, the liquid crystal polymer is suitable for the molding of vibration-proof member 8 or the integral molding of the composite body of vibration-proof member 8 and seat 9, and use of polyphthalamide (PPA) obtains the same effect.

Alternatively, silicon can also be cited as an example of the elastic material constituting vibration-proof member 8. Silicon has the vibration absorbing performance like the liquid crystal polymer, and silicon also has an extremely small temperature characteristic of a Young's modulus. Therefore, the temperature characteristic of the angular velocity sensor can be improved.

When the plate-spring material, such as stainless steel and phosphor bronze, is used as vibration-proof member 8, connection portion 8d of vibration-proof member 8 is molded in seat 9 to form an integral structure. Therefore, suspension portion 8e having the step structure including surface 8a parallel to the vibration plane (XY-plane) of angular velocity sensor element 2 and surface 8b orthogonal to the vibration plane (XY-plane) is made of the plate-spring material, and the productivity can be improved such that the portion including the step structure is made of the elastic material.

Second Exemplary Embodiment

An angular velocity sensor according to a second exemplary embodiment of the present invention will be described below.

Figure 8:
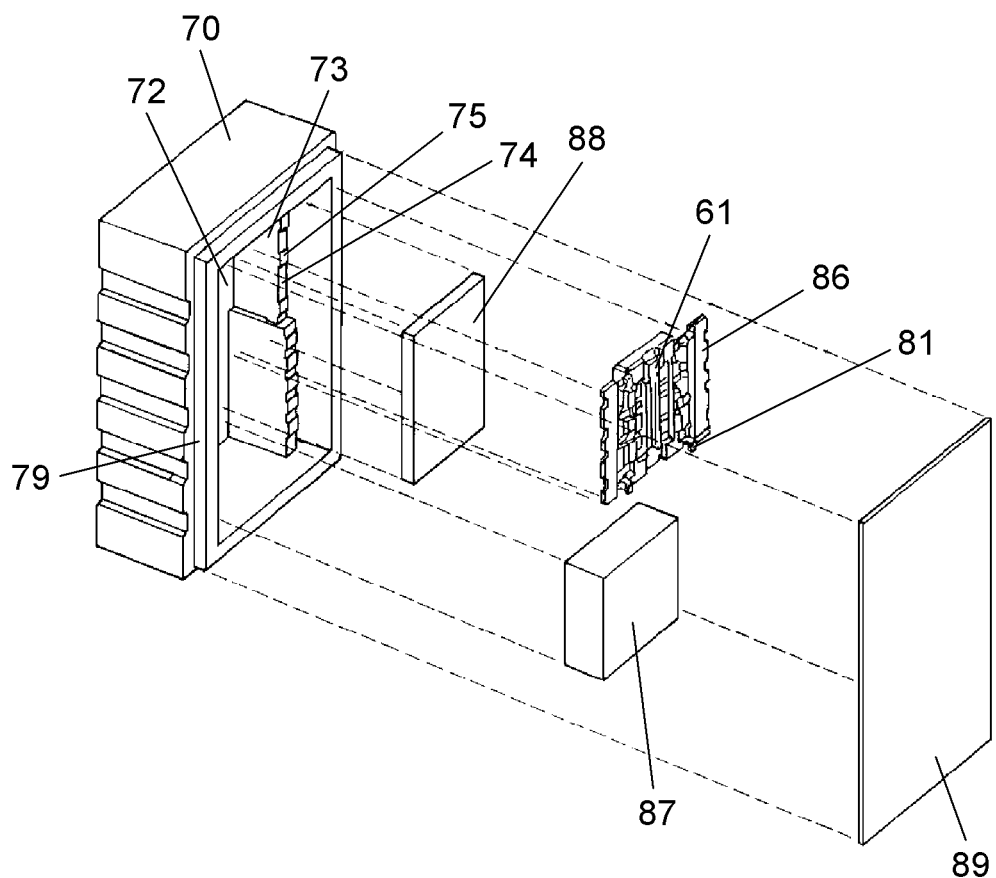
FIG. 8 is an exploded perspective view of an angular velocity sensor according to a second exemplary embodiment of the present invention.
Figure 8:
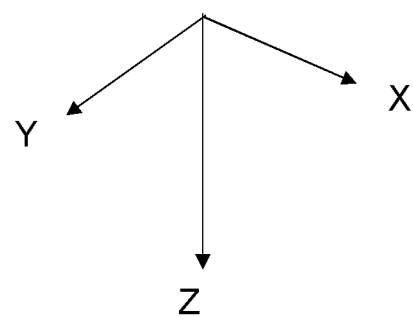
Figure 9:
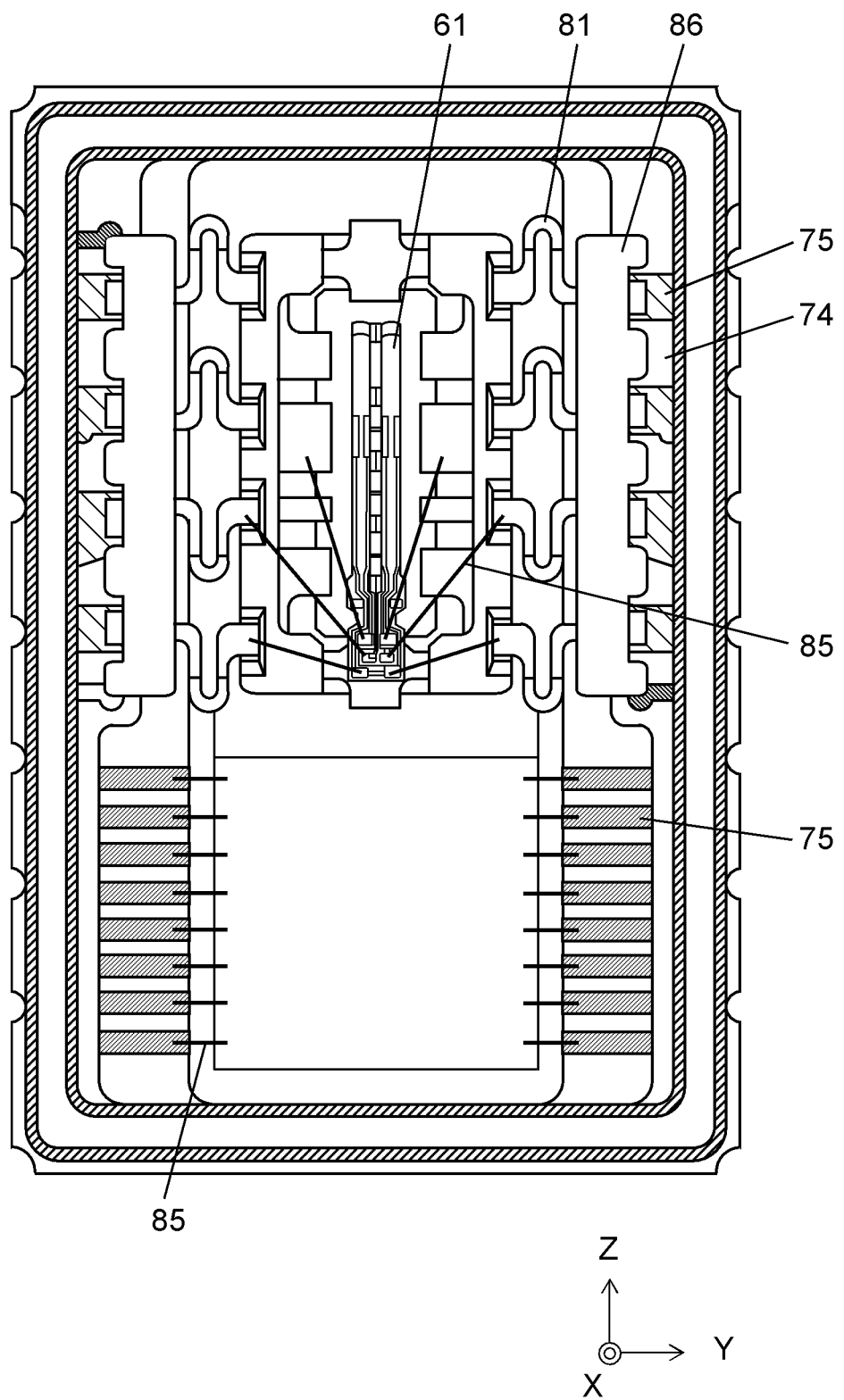
FIG. 9 is a plan view illustrating a state in which a lid of the angular velocity sensor according to the second exemplary embodiment of the present invention is taken off.
Figure 10:
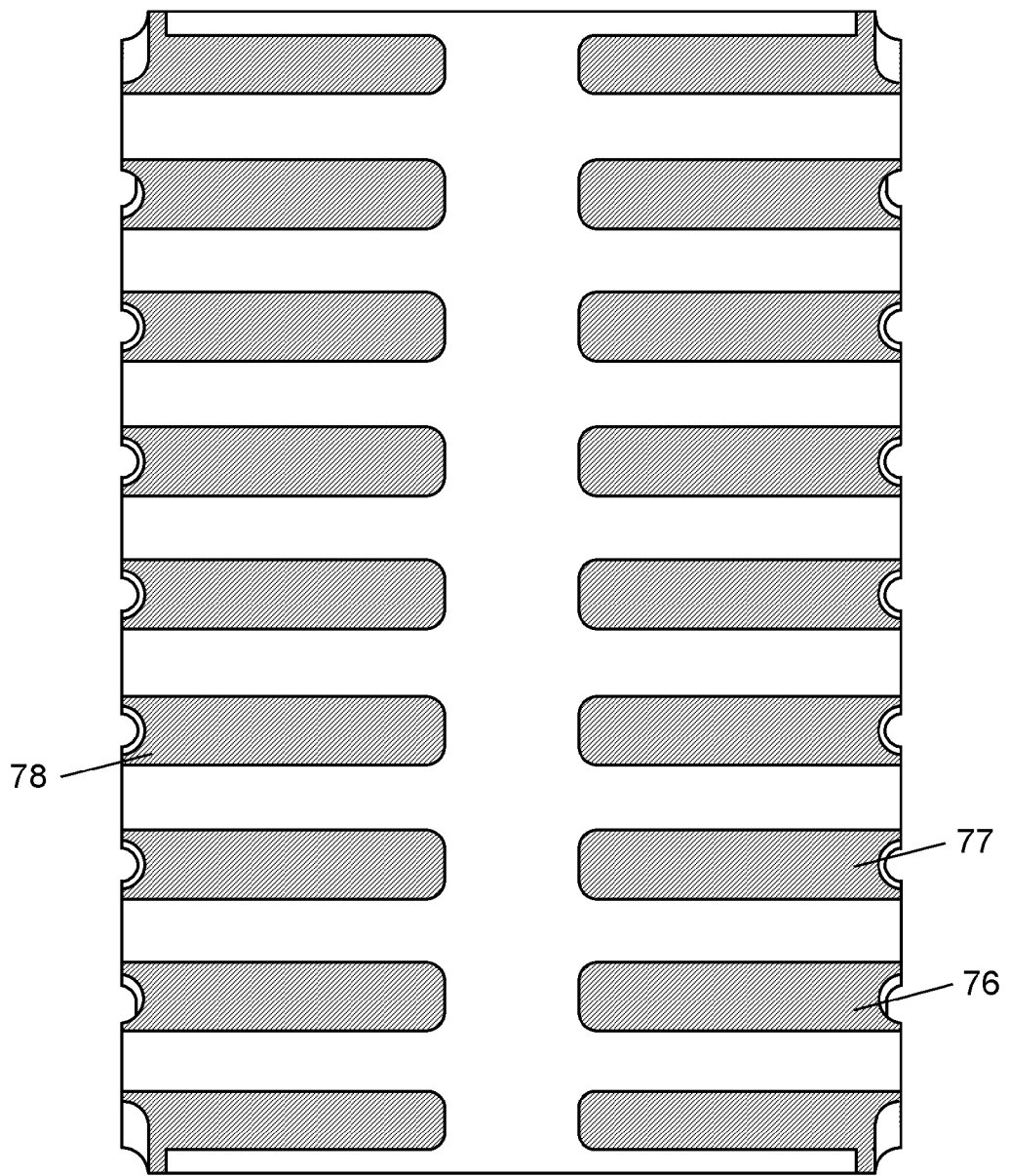
FIG. 10 is a bottom view of the angular velocity sensor according to the second exemplary embodiment of the present invention.
Figure 11:
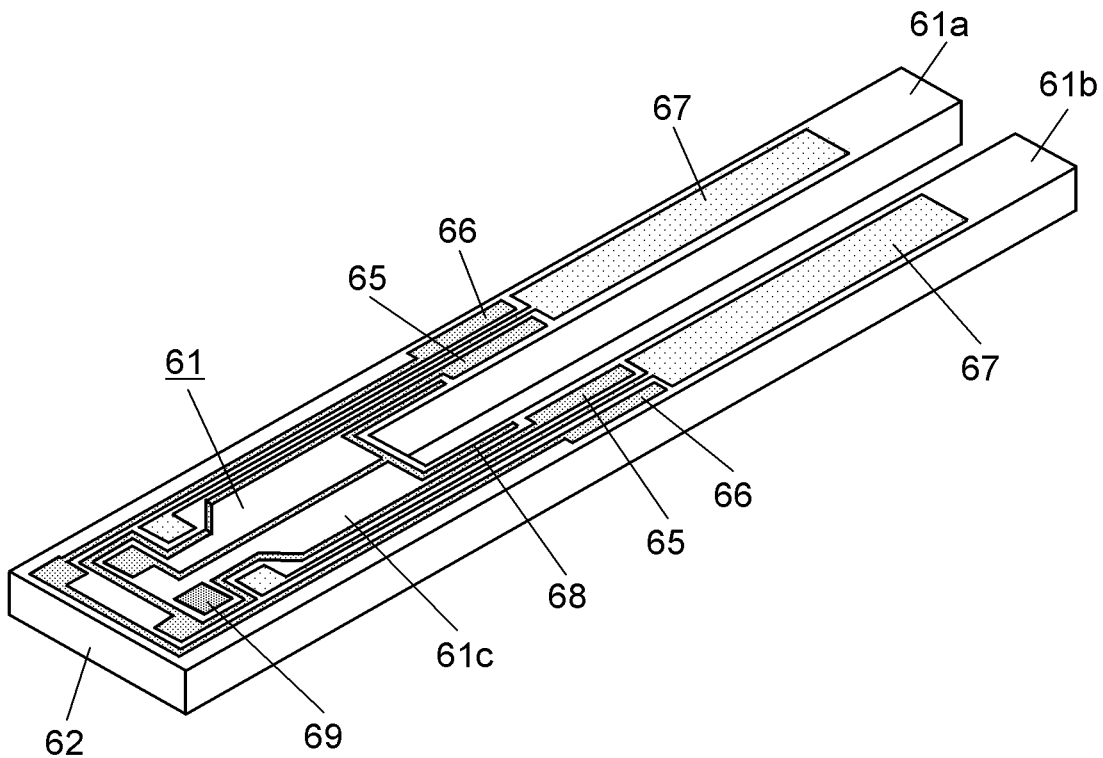
FIG. 11 is a perspective view of a vibrator in the angular velocity sensor according to the second exemplary embodiment of the present invention.
Figure 12:
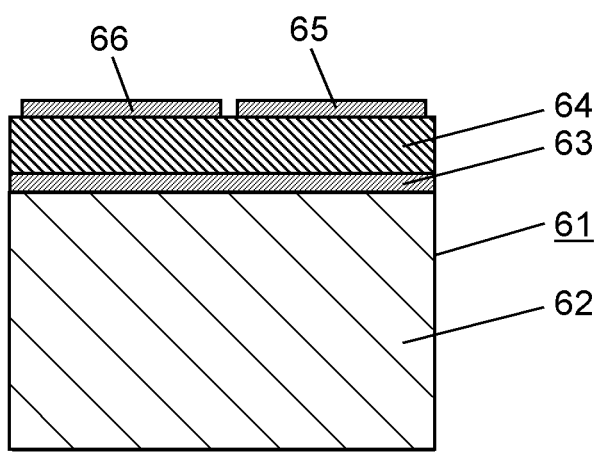
FIG. 12 is a side sectional view of the vibrator in the angular velocity sensor according to the second exemplary embodiment of the present invention.
Figure 13:
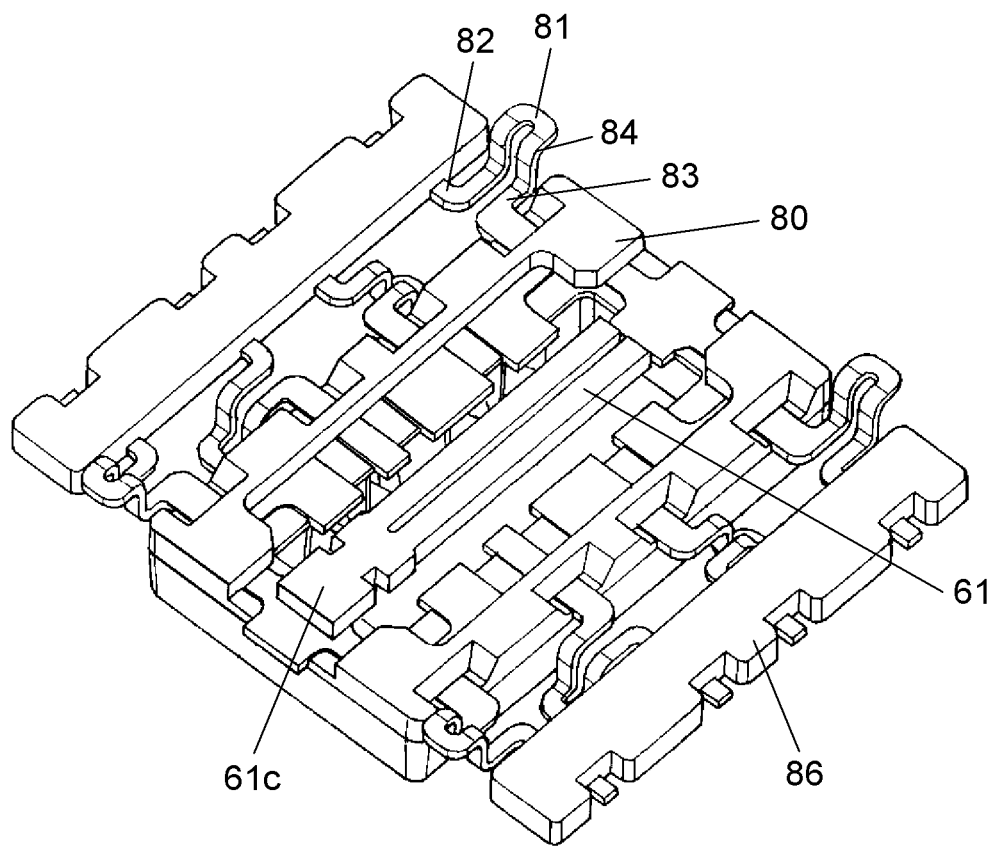
FIG. 13 is a perspective view illustrating a state in which the vibrator and terminals are fixed to a placing member in the angular velocity sensor according to the second exemplary embodiment of the present invention.
Figure 13:
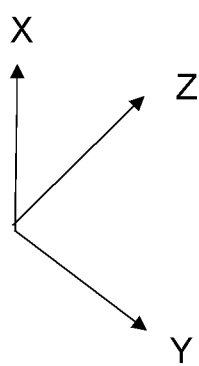

FIG. 8 is an exploded perspective view of an angular velocity sensor according to a second exemplary embodiment of the present invention. FIG. 9 is a plan view illustrating a state in which a lid of the angular velocity sensor according to the second exemplary embodiment of the present invention is taken off. FIG. 10 is a bottom view of the angular velocity sensor according to the second exemplary embodiment of the present invention. FIG. 11 is a perspective view of a vibrator in the angular velocity sensor according to the second exemplary embodiment of the present invention. FIG. 12 is a side sectional view of the vibrator in the angular velocity sensor according to the second exemplary embodiment of the present invention. FIG. 13 is a perspective view illustrating a state in which the vibrator and terminals are fixed to a placing member in the angular velocity sensor according to the second exemplary embodiment of the present invention.

Referring to FIGS. 8 to 13, reference numeral 61 denotes a tuning-fork type vibrator, and vibrator 61 includes first arm portion 61a, second arm portion 61b, and support portion 61c that connects one end of first arm portion 61a and one end of second arm portion 61b as illustrated in FIG. 11. As illustrated in FIG. 12, in vibrator 61, common GND electrode 63 made of an alloy thin film of Pt and Ti is provided in a whole upper surface of base material 62 made of Si, and piezoelectric layer 64 made of a PZT thin film is provided in the upper surface of common GND electrode 63. As illustrated in FIG. 11, in the tuning-fork type vibrator 61, a pair of first driving electrodes 65 is provided in the upper surface of piezoelectric layer 64 while located inside in the substantial center of the upper surface, and a pair of second driving electrodes 66 is provided in the upper surface of piezoelectric layer 64 while located outside in the substantial center of the upper surface. In vibrator 61, a pair of detection electrodes 67 is provided in the upper surface of piezoelectric layer 64 while located on a leading end side of the upper surface, and monitor electrode 68 is provided in the upper surface of piezoelectric layer 64 while located on a base side from first driving electrode 65. GND electrode 69 is provided in the surface of piezoelectric layer 64 while located in the surface of support portion 61c in vibrator 61.

Reference numeral 70 denotes a ceramic case, and case 70 has a layer structure of ceramic and a wiring conductor from an inner bottom surface and an inner side surface to an outer bottom surface, and multilayer circuit board 72 having a wiring pattern (not illustrated) is provided in case 70. Terminal electrode 75 is provided in step portion 74 provided in an inner side surface of sidewall 73 of case 70, supply electrode 76, GND electrode 77, and output electrode 78 are provided in the outer bottom surface of case 70, and terminal electrode 75 is electrically connected to supply electrode 76, GND electrode 77, and output electrode 78 by the wiring pattern (not illustrated). Metal frame 79 made of kovar is provided on the upper surface of sidewall 73 of case 70. Reference numeral 80 denotes a resin placing member, and placing member 80 supports support portion 61c of vibrator 61, and is supported from the outside by eight terminals 81 in each of which one end is electrically connected to terminal electrode 75 of case 70. Each of terminals 81 includes Y-axis-direction extended portion 82, Z-axis-direction extended portion 83, and X-axis-direction extended portion 84. In eight terminals 81, X-axis-direction extended portions 84 of four terminals 81 disposed outside are extended in a frontside direction, and X-axis-direction extended portions 84 of four terminals 81 disposed inside are extended in a backside direction. That is, the barycenter of placing member 80 is substantially matched with the sum of barycenters of eight terminals 81.

The X-axis-direction extended portions of eight terminals 81 are alternately extended in the frontside direction and the backside direction, whereby the barycenters of terminals 81 are substantially matched with the barycenter of placing member 80. Therefore, advantageously the upward or downward movement of vibrator 61, which is caused by baricentric movements of plural terminals in applying the angular velocity is applied in the Y-axis direction and the Z-axis direction, is eliminated to stabilize the signal generated from vibrator 61.

First driving electrode 65, second driving electrode 66, detection electrode 67, and GND electrode 69 of vibrator 61 are electrically connected to terminals 81 by wires 85. Reference numeral 86 denotes a resin reinforcing member, and reinforcing member 86 is provided so as to cover a connection point of terminal 81 and terminal electrode 75 of case 70, thereby burying terminal 81 in case 70.

Because terminal 81 connected to terminal electrode 75 of case 70 is buried in case 70, the connection of terminal electrode 75 and terminal 81 is strengthened, and therefore advantageously the electric connection between terminal electrode 75 and terminal 81 can be ensured even if the strong vibration is applied to the angular velocity sensor.

Reference numeral 87 denotes an acceleration sensor element, and acceleration sensor element 87 is provided in the inner bottom surface of case 70, and electrically connected to terminal electrode 75 by wire 85. Reference numeral 88 denotes an IC, and IC 88 is provided in the inner bottom surface of case 70 in parallel to acceleration sensor element 87, and IC 88 processes the output signal from vibrator 61 and the output signal from acceleration sensor element 87. Reference numeral 89 denotes a lid made of kovar, and lid 89 closes the opening of case 70.

A method for assembling the angular velocity sensor according to the second exemplary embodiment of the present invention having the above configuration will be described below.

Figure 14A:
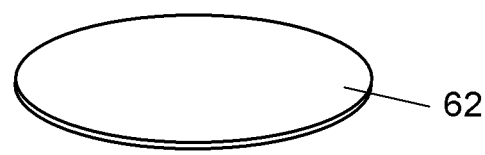
FIG. 14A is an assembly process chart of the vibrator in the angular velocity sensor according to the second exemplary embodiment of the present invention.
Figure 14B:
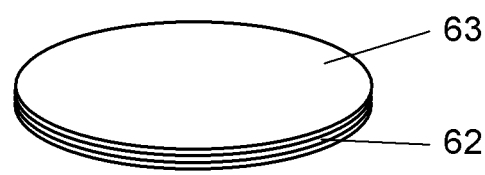
FIG. 14B is an assembly process chart of the vibrator in the angular velocity sensor according to the second exemplary embodiment of the present invention.
Figure 14C:
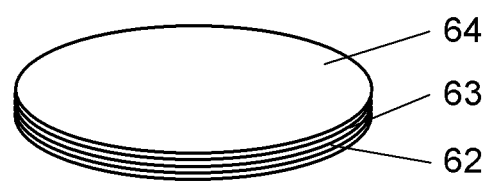
FIG. 14C is an assembly process chart of the vibrator in the angular velocity sensor according to the second exemplary embodiment of the present invention.

FIGS. 14A to 14F are assembly process charts of the vibrator in the angular velocity sensor according to the second exemplary embodiment of the present invention. As illustrated in FIGS. 14A to 14F, as illustrated in FIG. 14B, common GND electrode 63 made of an alloy thin film of Pt and Ti is first formed by evaporation on the upper surface of previously-prepared base material 62 made of Si illustrated in FIG. 14A. Then, as illustrated in FIG. 14C, piezoelectric layer 64 made of a PZT thin film is formed by the evaporation on the upper surface of common GND electrode 63.

Figure 14D:
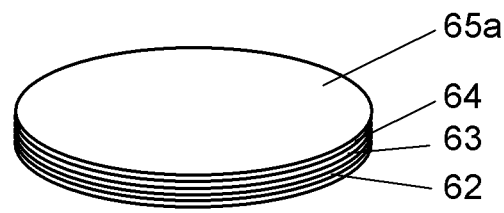
FIG. 14D is an assembly process chart of the vibrator in the angular velocity sensor according to the second exemplary embodiment of the present invention.
Figure 14E:
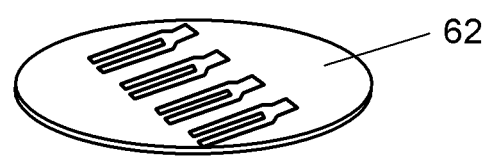
FIG. 14E is an assembly process chart of the vibrator in the angular velocity sensor according to the second exemplary embodiment of the present invention.

Subsequently, as illustrated in FIG. 14D, forming electrode 65a made of an alloy thin film of Ti and Au is formed by evaporation on the upper surface of piezoelectric layer 64. Then, as illustrated in FIG. 14E, unnecessary points of common GND electrode 63, piezoelectric layer 64, and forming electrode 65a are removed such that a predetermined shape is obtained, and first driving electrode 65, second driving electrode 66, detection electrode 67, monitor electrode 68, and GND electrode 69 are formed on the upper surface of piezoelectric layer 64.

Then, while a voltage is applied to the side of common GND electrode 63, first driving electrode 65, second driving electrode 66, detection electrode 67, monitor electrode 68, and GND electrode 69 are grounded to polarize piezoelectric layer 64.

Figure 14F:
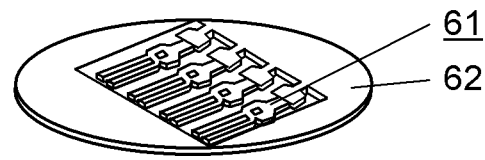
FIG. 14F is an assembly process chart of the vibrator in the angular velocity sensor according to the second exemplary embodiment of the present invention.
Figure 15:
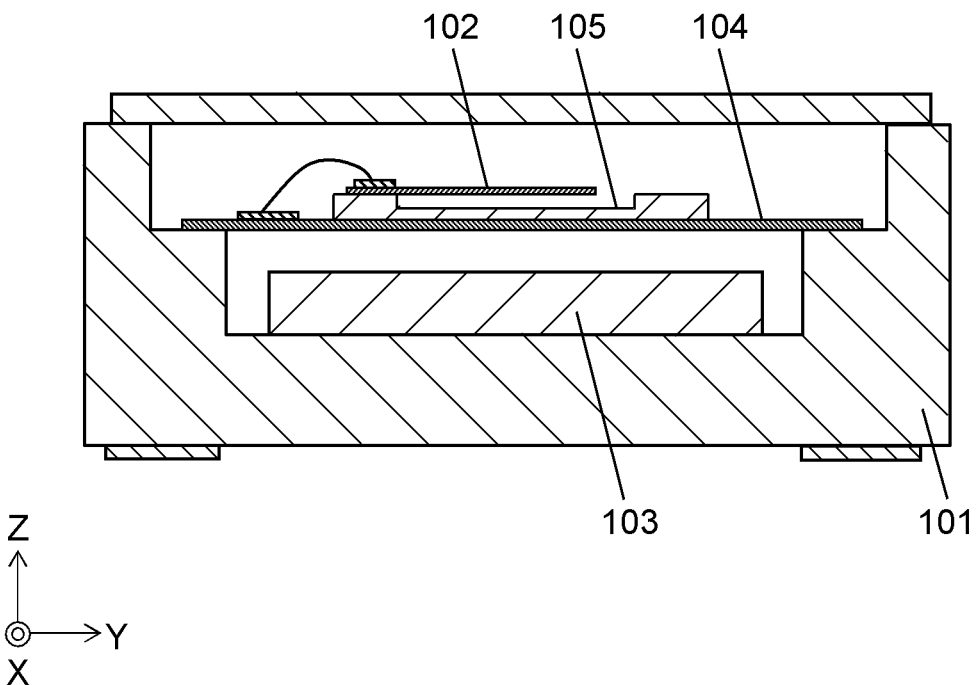
FIG. 15 is a sectional view of a conventional angular velocity sensor.

Subsequently, as illustrated in FIG. 14F, individual vibrators 61 are formed by removing the unnecessary points of base material 62.

After sidewall 73 and step portion 74, which are made of ceramic, are formed in a whole outer periphery of an upper surface of multilayer circuit board 72 including a previously-prepared ceramic insulator (not illustrated) and a previously-prepared wiring conductor (not illustrated), terminal electrode 75 made of Au is formed on the upper surface of the step portion 74, and metal frame 79 made of kovar is fixed to the upper surface of sidewall 73.

Then, supply electrode 76, GND electrode 77, and output electrode 78, which are made of Ag, are formed on the lower surface of multilayer circuit board 72.

IC 88 is mounted on the upper surface of multilayer circuit board 72 of case 70, and then IC 88 and multilayer circuit board 72 are electrically connected.

After acceleration sensor element 87 is mounted on the upper surface of multilayer circuit board 72 of case 70 so as to be provided in parallel to IC 88, acceleration sensor element 87 and terminal electrode 75 of case 70 are electrically connected through wire 85 made of aluminum by wire bonding.

After insert molding of eight terminals 81 in placing member 80 is performed, the lower surface of the support portion 61c of vibrator 61 is fixed to placing member 80, and then first driving electrode 65, second driving electrode 66, detection electrode 67, monitor electrode 68, and GND electrode 69, which are formed on the upper surface of vibrator 61, are electrically connected to terminals 81 through wires 85 made of aluminum by wire bonding.

After eight terminals 81 are soldered to terminal electrodes 75 of case 70, terminals 81 are buried in case 70 by covering terminals 81 with resin reinforcing member 86.

Then, metallic lid 89 is fixed to the opening of case 70 in a nitrogen atmosphere by seam welding.

An operation of the angular velocity sensor according to the second exemplary embodiment of the present invention having the above configuration will be described below.

When the negative voltage is applied to second driving electrode 66 while the positive voltage is applied to first arm portion 61a of tuning-fork type vibrator 61 and first driving electrodes 65 provided in first arm portion 61a, first arm portion 61a and second arm portion 61b of vibrator 61 are opened outward because piezoelectric layer 64 located below second driving electrode 66 shrinks while piezoelectric layer 64 located below first driving electrode 65 extends.

When the positive voltage is applied to second driving electrode 66 while the negative voltage is applied to first arm portion 61a of tuning-fork type vibrator 61 and first driving electrodes 65 provided in first arm portion 61a, first arm portion 61a and second arm portion 61b of vibrator 61 are closed inward because piezoelectric layer 64 located below second driving electrode 66 extends while piezoelectric layer 64 located below first driving electrode 65 shrinks. That is, when the AC voltage is applied to first driving electrode 65 and second driving electrode 66 of the tuning-fork type vibrator 61, first arm portion 61a and second arm portion 61b of the vibrator 61 perform flexion movement having an eigenfrequency in the in-plane direction at a velocity V. In the flexion movement of vibrator 61, the voltage applied to first driving electrode 65 and second driving electrode 66 is adjusted such that the output signal generated from monitor electrode 68 is kept constant, thereby controlling an amplitude of the flexion vibration.

When vibrator 61 rotates at angular velocity ω about the center axis (sensing axis) in the longitudinal direction while first arm portion 61a and second arm portion 61b of vibrator 61 perform the flexion movement at the eigenfrequency, the Coriolis force of F=2 mV×ω is generated in the arms of first arm portion 61a and second arm portion 61b of vibrator 61. The output signal including the charge, which is generated by the Coriolis force in piezoelectric layer 64 located below detection electrode 67, is inputted to IC 88 through detection electrode 67, wire 85, terminal electrode 75, and the wiring pattern (not illustrated) of case 70, and the waveform processing is performed to the output signal. Then, the output signal of the angular velocity is outputted to the outside from output electrode 78 of case 70.

When the acceleration is applied to the angular velocity and acceleration detecting composite sensor, the output signal is generated in acceleration sensor element 87 according to the acceleration. After the signal processing of the output signal is performed by IC 88 through multilayer circuit board 72, terminal electrode 75, and wire 85, the output signal is inputted to terminal electrode 75 through wire 85 and inputted to the target computer (not illustrated) through multilayer circuit board 72 and output electrode 78, thereby detecting the acceleration.

At this point, it is assumed that the disturbance vibration of about 25 kHz is applied in the Z-axis direction from the outside.

In terminal 81, the Z-axis-direction vibration applied from the outside is damped by X-axis-direction extended portion 84 and Y-axis-direction extended portion 82.

Similarly, when the disturbance vibration of about 25 kHz is applied in the X-axis direction from the outside, the X-axis-direction vibration applied from the outside is damped by Y-axis-direction extended portion 82 and Z-axis-direction extended portion 83.

When the disturbance vibration of about 25 kHz is applied in the Y-axis direction from the outside, the Y-axis-direction vibration applied from the outside can be damped by Z-axis-direction extended portion 83 and X-axis-direction extended portion 84.

That is, in an angular velocity sensor of an exemplary embodiment of the present invention, because X-axis-direction extended portion 84, Y-axis-direction extended portion 82, and Z-axis-direction extended portion 83 are provided in terminal 81, the Z-axis-direction vibration applied from the outside is damped by X-axis-direction extended portion 84 and Y-axis-direction extended portion 82, the X-axis-direction vibration applied from the outside is damped by Y-axis-direction extended portion 82 and Z-axis-direction extended portion 83, and the Y-axis-direction vibration applied from the outside is damped by Z-axis-direction extended portion 83 and X-axis-direction extended portion 84, and all the vibrations in the three axis directions can be damped.

The angular velocity sensor of the present invention has the effect to be able to improve the detection accuracy of the angular velocity sensor element, and is particularly useful in the in-vehicle angular velocity sensor.

Moreover, the present invention advantageously provides the angular velocity sensor, in which the problem such that the Y-axis-direction and Z-axis-direction vibrations applied from the outside cannot be damped is eliminated, and all the vibrations in the three axis directions can be damped. Particularly, the angular velocity sensor of the present invention is useful in the attitude control and navigation system of the mobile body, such as the aircraft and the vehicle.

Furthermore, the present invention advantageously provides an angular velocity and acceleration detecting composite sensor, in which the problem such that the acceleration output signal is detected even though the acceleration is not generated by directly transmitting the flexion vibration of the vibrating body in the angular velocity detector to the acceleration detector is eliminated to improve the reliability. Particularly, the angular velocity and acceleration detecting composite sensor of the present invention is useful in the attitude control and navigation system of the mobile body, such as the aircraft and the vehicle.

What is claimed is:

1. An angular velocity sensor comprising:
    a package;
    an angular velocity sensor element disposed in the package and having a vibration plane;
    a seat that supports the angular velocity sensor element to ensure a vibrating space of the angular velocity sensor element; and
    a vibration-proof member that suspends the seat in an internal space of the package, wherein
    the vibration-proof member includes:
        a connection portion to the package; and
        a suspension portion located between the connection portion and a connection portion to the seat, and a height of a barycentric position of the suspension portion is matched with a height of a barycentric position of a composite body including the angular velocity sensor element, the seat, and connection portion to the seat in the vibration-proof member;
        wherein the suspension portion has a step-shaped structure including a first surface and a second surface, the first surface disposed parallel to the vibration plane of the angular velocity sensor and the second surface disposed orthogonal to the vibration plane of the angular velocity sensor; and
        wherein the height of the barycentric position of the suspension portion and the height of the barycentric position of the composite body are matched based on the vibration lane in a driving vibration of the angular velocity sensor element.

2. The angular velocity sensor according to claim 1, wherein
    the vibration-proof member and the seat are integrally molded using an elastic material.

3. The angular velocity sensor according to claim 1, wherein
    the vibration-proof member is made of a liquid crystal polymer.

4. The angular velocity sensor according to claim 1, wherein
    the vibration-proof member is made of polyphthalamide.

5. The angular velocity sensor according to claim 1, wherein
    the vibration-proof member is made of silicon.

6. The angular velocity sensor according to claim 1, wherein
    the vibration-proof member is made of a plate-spring material, and the connection portion to the seat is molded in the seat.

7. The angular velocity sensor according to claim 1, wherein
    the angular velocity sensor includes at least two of the vibration-proof members which are disposed on opposite sides of the angular velocity sensor element in each vibration direction, respectively.

* * * * *